United States Patent
Pasqualini

(10) Patent No.: US 7,863,962 B2
(45) Date of Patent: Jan. 4, 2011

(54) HIGH VOLTAGE CMOS OUTPUT BUFFER CONSTRUCTED FROM LOW VOLTAGE CMOS TRANSISTORS

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 357 days.

(21) Appl. No.: 12/148,224

(22) Filed: Apr. 17, 2008

(65) Prior Publication Data

US 2009/0261865 A1   Oct. 22, 2009

(51) Int. Cl.
  *H03L 5/00* (2006.01)
(52) U.S. Cl. .......................... 327/333; 326/81
(58) Field of Classification Search .................. 327/333; 326/68, 80, 81; 365/189.11
See application file for complete search history.

(56) References Cited

U.S. PATENT DOCUMENTS

| 5,378,943 | A | * | 1/1995 | Dennard | 326/68 |
| 5,537,059 | A | * | 7/1996 | Asahina | 326/81 |
| 6,664,823 | B2 | * | 12/2003 | Yokoi | 327/333 |

* cited by examiner

*Primary Examiner*—Long Nguyen
(74) *Attorney, Agent, or Firm*—Mark C. Pickering

(57) ABSTRACT

A high voltage CMOS output buffer is constructed from low voltage CMOS transistors. The output buffer employs a series of unique CMOS inverter stages, each of which contains a switched PMOS transistor, one or more voltage drop blocks, and a switched NMOS transistor. The voltage drop blocks are composed of stacked PMOS transistors that are diode-connected—i.e., the PMOS gate terminal is connected to the PMOS drain terminal, and the PMOS body (N-well) terminal is connected to the PMOS source terminal. The diode-connected PMOS transistors reduce the voltage across the transistor gate oxide to a safe value, for all internal PMOS/NMOS transistors inside the CMOS output buffer.

19 Claims, 6 Drawing Sheets

HIGH VOLTAGE CMOS OUTPUT BUFFER CONSTRUCTED FROM LOW VOLTAGE CMOS TRANSISTORS

BACKGROUND OF THE INVENTION

1. Field of the Invention

The present invention relates to CMOS output buffers, and more particularly, to a high voltage CMOS output buffer that is constructed from low voltage CMOS transistors.

2. Description of the Related Art

CMOS processing rules are being continually scaled downward, producing smaller and faster transistors that have shorter channel lengths and lower threshold voltages. CMOS device scaling also offers other important advantages, including shorter interconnect wires that have lower capacitance, and the use of lower VDD voltages.

The use of lower VDD voltages is extremely important, because it significantly decreases $PWR_{DIG}$, the digital power dissipation inside the core of a CMOS chip. The formula for calculating $PWR_{DIG}$ is shown in EQ. 1.

$$PWR_{DIG} = C \cdot VDD_{INT}^2 \cdot F \qquad \text{EQ. 1}$$

where C represents the average gate plus interconnect capacitance, $VDD_{INT}$ represents the internal (digital core) power supply voltage, and F represents the average operating frequency of the logic gates inside the digital core.

Referring to EQ. 1, it can be seen that CMOS device scaling reduces $PWR_{DIG}$ in two ways. First of all, it lowers $PWR_{DIG}$ by lowering the average gate plus interconnect capacitance C. Secondly, it again lowers $PWR_{DIG}$ by allowing a lower $VDD_{INT}$ voltage to be employed. Of course, because $PWR_{DIG}$ depends upon the square of $VDD_{INT}$, lowering $VDD_{INT}$ makes the largest contribution to decreasing the power dissipation inside the digital core of a chip.

Furthermore, since CMOS device scaling has been progressing at a very rapid rate, $VDD_{INT}$ has also been decreasing at a very rapid rate. For example, in recent years, $VDD_{INT}$ has progressed from 5V to 3.3V, from 3.3V to 2.5V, from 2.5V to 1V—and even lower.

A basic problem, however, is that the standard system power supply voltage $VDD_{SYS}$ has been decreasing at a much slower rate than $VDD_{INT}$. For example, in current systems, the most widely used $VDD_{SYS}$ voltages are still 5V and 3.3V. Because of this VDD disparity, CMOS I/O buffers must operate from the higher $VDD_{SYS}$ voltage, while the CMOS logic gates inside the digital core must operate from the lower $VDD_{INT}$ voltage.

With regard to CMOS output buffers, the above VDD disparity can be resolved in two ways. In a first approach, only the system power supply voltage $VDD_{SYS}$ is distributed to a CMOS chip. This approach is illustrated in FIG. 1A, which shows a block diagram of a prior-art CMOS chip 100. As shown in FIG. 1A, since CMOS chip 100 only receives the system power supply voltage $VDD_{SYS}$, CMOS chip 100 must contain an on-chip voltage regulator 110.

In this example, voltage regulator 110 is used to reduce the system power supply voltage $VDD_{SYS}$ to the lower internal power supply voltage $VDD_{INT}$. Furthermore, the internal power supply voltage $VDD_{INT}$ is fed to a digital core 112, which only contains low voltage CMOS transistors. In addition, the system power supply voltage $VDD_{SYS}$ is also fed to an output buffer block 114. Moreover, $VDD_{SYS}$ and $VDD_{INT}$ are both fed to a level shift-down block 116, and to a level shift-up block 118. As shown in FIG. 1A, these level shift blocks act as voltage translators for the signals that go to and from digital core 112.

In a second approach, the higher system power supply voltage $VDD_{SYS}$ and the lower internal power supply voltage $VDD_{INT}$ are both distributed to a CMOS chip. This approach is illustrated in FIG. 1B, which shows a block diagram of a prior-art CMOS chip 150. As shown in FIG. 1B, CMOS chip 150 receives the system power supply voltage $VDD_{SYS}$ and the internal power supply voltage $VDD_{INT}$. Therefore, CMOS chip 150 does not need an on-chip voltage regulator. In this example, the internal power supply voltage $VDD_{INT}$ is directly fed to a digital core 152, and the system power supply voltage $VDD_{SYS}$ is directly fed to an output buffer block 154. Furthermore, the $VDD_{SYS}$ and $VDD_{INT}$ voltages are both fed to a level shift-down block 156, and to a level shift-up block 158.

The two approaches described above both require that the CMOS output buffers 114/154 operate from the higher $VDD_{SYS}$ voltage. Thus, using prior art, this requirement is often satisfied by employing two transistor types: low voltage (low threshold) PMOS/NMOS transistors operating from $VDD_{INT}$, and high voltage (high threshold) PMOS/NMOS transistors operating from $VDD_{SYS}$. Referring to FIGS. 1A and 1B, the low voltage transistors are used inside the digital core 112/152, and the high voltage transistors are used inside the I/O cells 114/154.

Of course, fabricating low voltage CMOS transistors and high voltage CMOS transistors on the same chip increases CMOS processing complexity, which increases chip fabrication cost. Therefore, if the high voltage transistors could be eliminated, the chip fabrication cost could be substantially reduced.

Furthermore, if the high voltage transistors could be eliminated, shift-up blocks 118/158 and shift-down blocks 116/156 could also be eliminated, further reducing the chip fabrication cost. Therefore, there is an obvious need for a method of implementing high voltage CMOS output buffers using only low voltage CMOS transistors. Two examples of this need include the ability to implement 5V output buffers using 3.3V transistors, and the ability to implement 3.3V output buffers using 2.5V transistors.

CMOS transistors have four terminals: a gate terminal, a drain terminal, a source terminal, and a body (or substrate) terminal. In most CMOS processes, the NMOS transistors are not fabricated inside of wells. Therefore, the bodies of the NMOS transistors are formed by the p-substrate, which is usually grounded.

Furthermore, in all CMOS processes, the PMOS transistors are always fabricated inside of N-wells, and the bodies of the PMOS transistors are formed by these N-wells. Thus, in order to avoid forward biasing the PMOS source/drain diodes, the PMOS N-wells are usually connected to the most positive voltage available, VDD. Since this connection is not mandatory, it is often permissible to connect the body (N-well) of a PMOS transistor to its own source terminal.

FIGS. 2A-2B show schematic diagrams that illustrate a prior-art PMOS transistor 200, and a prior-art NMOS transistor 250. As shown in FIGS. 2A-2B, both transistors contain a gate terminal G, a drain terminal D, a source terminal S, and a body terminal B. As a result, there are six possible terminal-to-terminal voltages for PMOS transistor 200 and NMOS transistor 250. The six possible terminal-to-terminal voltages include a drain-to-gate voltage $V_{DG}$, a drain-to-source voltage $V_{DS}$, a drain-to-body voltage $V_{DB}$, a gate-to-source voltage $V_{GS}$, a gate-to-body voltage $V_{GB}$, and a source-to-body voltage $V_{SB}$.

Furthermore, when two or more of the transistor terminals are electrically connected together in a meaningful way, the number of transistor terminals will be reduced from four terminals to three terminals, or from four terminals to two terminals. As a result, the possible number of terminal-to-terminal voltage pairs will be reduced from six terminal pairs to three terminal pairs, or from six terminal pairs to one terminal pair.

The reduction in the number of terminal-to-terminal voltage pairs is illustrated in FIGS. 3A-3D and 4A-4D. FIGS. 3A and 4A show schematic diagrams that illustrate prior-art PMOS transistor 200 and NMOS transistor 250, with the body connected to the source. In this case, the source-to-body voltage $V_{SB}$ is zero, the gate-to-source voltage $V_{GS}$ and the gate-to-body voltage $V_{GB}$ are the same, and the drain-to-source voltage $V_{DS}$ and the drain-to-body voltage $V_{DB}$ are also the same.

FIGS. 3B and 4B show schematic diagrams that illustrate prior-art PMOS transistor 200 and NMOS transistor 250, with the gate connected to the drain. In this case, the gate-to-drain voltage $V_{GD}$ is zero, the drain-to-source voltage $V_{DS}$ and the gate-to-source voltage $V_{GS}$ are the same, and the drain-to-body voltage $V_{DB}$ and the gate-to-body voltage $V_{GB}$ are also the same.

FIGS. 3C and 4C show schematic diagrams that illustrate prior-art PMOS transistor 200 and NMOS transistor 250, with the body connected to the source and the gate connected to the drain. In this case, the source-to-body voltage $V_{SB}$ is zero, the gate-to-source voltage $V_{GS}$ and the gate-to-body voltage $V_{GB}$ are the same, and the drain-to-source voltage $V_{DS}$ and the drain-to-body voltage $V_{DB}$ are also the same. In addition, the gate-to-drain voltage $V_{GD}$ is zero, and the drain-to-body voltage $V_{DB}$ and the gate-to-body voltage $V_{GB}$ are the same. As a result, only one unique terminal-to-terminal voltage is present.

FIGS. 3D and 4D show schematic diagrams that illustrate prior-art PMOS transistor 200 and NMOS transistor 250, with the body connected to the source and the drain. In this case, the source-to-body voltage $V_{SB}$, the drain-to-source voltage $V_{DS}$, and the drain-to-body voltage $V_{DB}$ are all equal to zero, and the gate-to-source voltage $V_{GS}$, the gate-to-body voltage $V_{GB}$, and the gate-to-drain voltage $V_{GD}$ are all the same. As a result, only one unique terminal-to-terminal voltage is present.

During normal transistor operation, all of the terminal-to-terminal voltages shown in FIGS. 2, 3 and 4 must be kept below a maximum value, which is usually determined by the breakdown voltage of the gate oxide. (This assumes that the PN junction breakdown voltage is greater than the gate oxide breakdown voltage, which is usually the case).

Furthermore, the maximum breakdown voltage of the gate oxide has two values: a DC value and a transient value. The DC value is always lower than the transient value, mainly because the DC value causes the maximum cumulative stress on the oxide. In contrast, the transient breakdown voltage of the gate oxide is always higher than the DC value, mainly because the transient value stresses the gate oxide for a smaller percentage of the time, resulting in less cumulative stress on the oxide.

FIG. 5A shows a schematic diagram that illustrates an example of a prior-art non-inverting tristate output buffer 500. In addition, FIG. 5B shows a schematic diagram that illustrates an example of a second prior-art non-inverting tristate output buffer 550.

Referring to FIG. 5A, buffer 500 employs a single NMOS transistor N1 and a single PMOS transistor P1, to drive the buffer output VOUT. In contrast, referring to FIG. 5B, buffer 550 employs two stacked PMOS transistors P1 and P2, and two stacked NMOS transistors N1 and N2, to drive the buffer output VOUT. Because of this, PMOS transistors P1 and P2 in FIG. 5B must be made approximately twice as large (wide) as PMOS transistor P1 in FIG. 5A. Similarly, NMOS transistors N1 and N2 in FIG. 5B must be made approximately twice as large (wide) as NMOS transistor N1 in FIG. 5A.

Nevertheless, output buffer 500 contains 18 transistors, whereas output buffer 550 only contains 8 transistors. Therefore, both buffers can be made comparable, in terms of circuit performance and circuit area.

DETAILED DESCRIPTION OF THE INVENTION

Figure 1A:
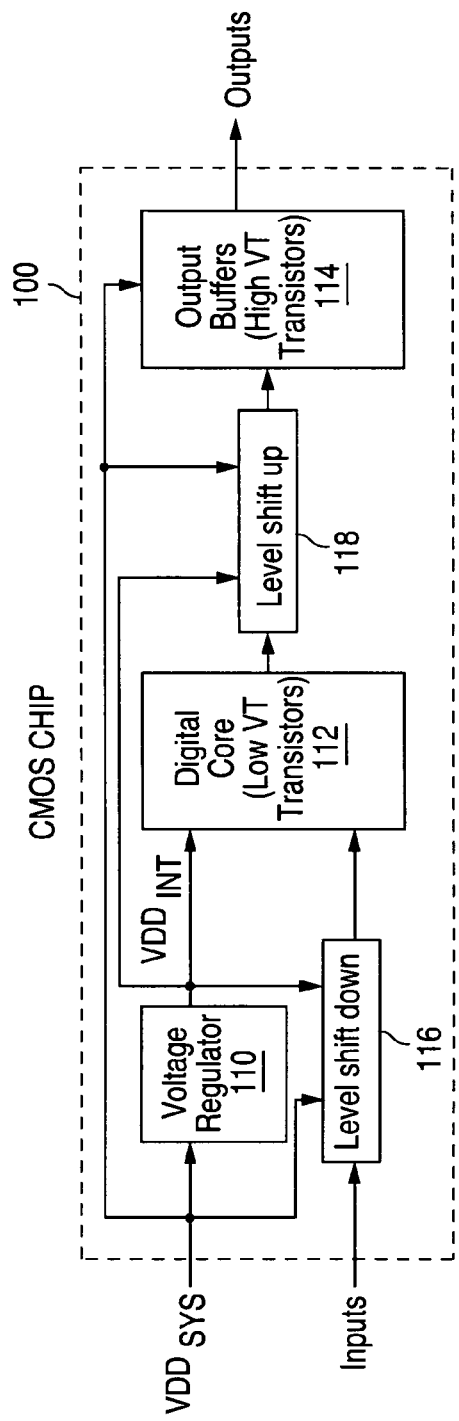
FIG. 1A is a block diagram illustrating an example of a prior-art CMOS chip 100.
Figure 1B:
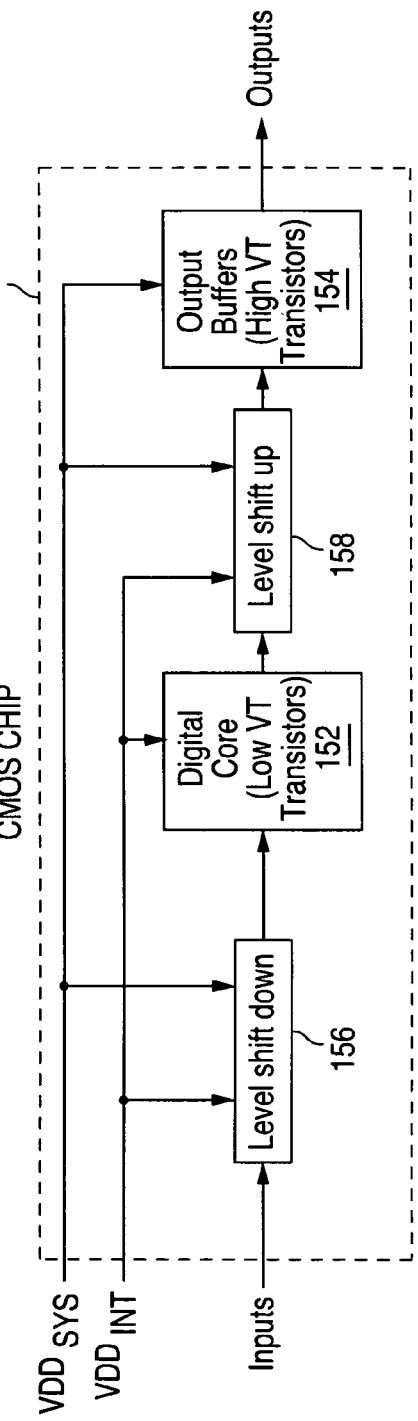
FIG. 1B is a block diagram illustrating an example of a prior-art CMOS chip 150.
Figure 2A:
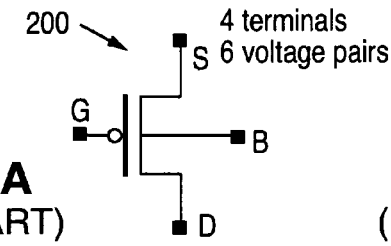
FIGS. 2A-2B are schematic diagrams illustrating a prior-art PMOS transistor 200 and a prior-art NMOS transistor 250, respectively.
Figure 2B:
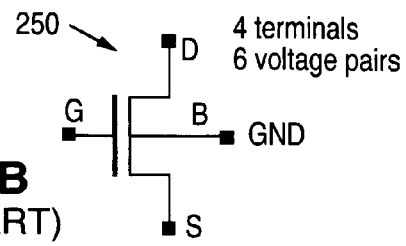
Figure 3A:
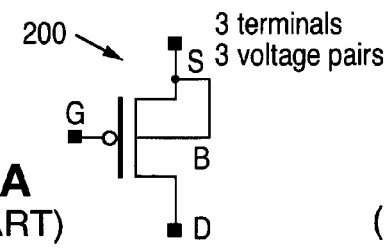
FIGS. 3A and 4A are schematic diagrams illustrating PMOS transistor 200 and NMOS transistor 250, with the body connected to the source.
Figure 4A:
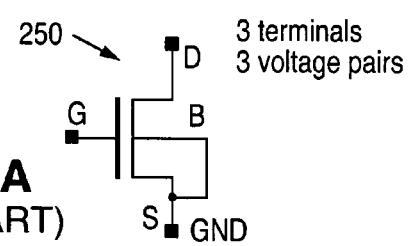
Figure 3B:
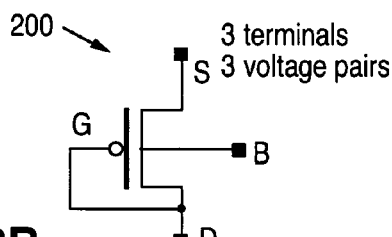
FIGS. 3B and 4B are schematic diagrams illustrating PMOS transistor 200 and NMOS transistor 250, with the gate connected to the drain.
Figure 4B:
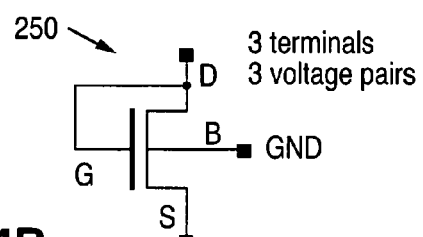
Figure 3C:
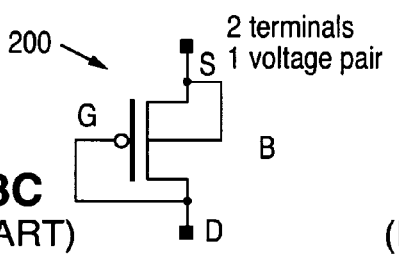
FIGS. 3C and 4C are schematic diagrams illustrating PMOS transistor 200 and NMOS transistor 250, with the body connected to the source and the gate connected to the drain.
Figure 4C:
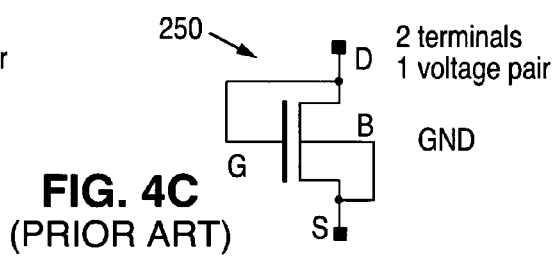
Figure 3D:
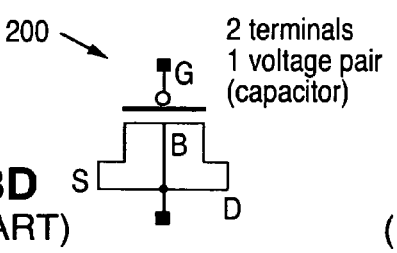
FIGS. 3D and 4D are schematic diagrams illustrating PMOS transistor 200 and NMOS transistor 250, with the body connected to the source and the drain.
Figure 4D:
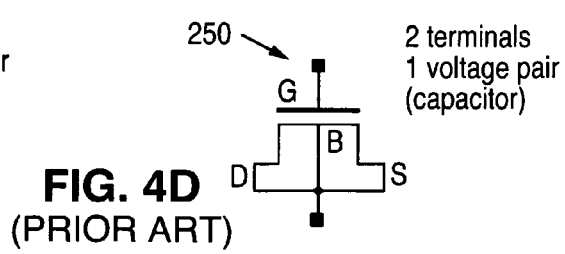
Figure 5A:
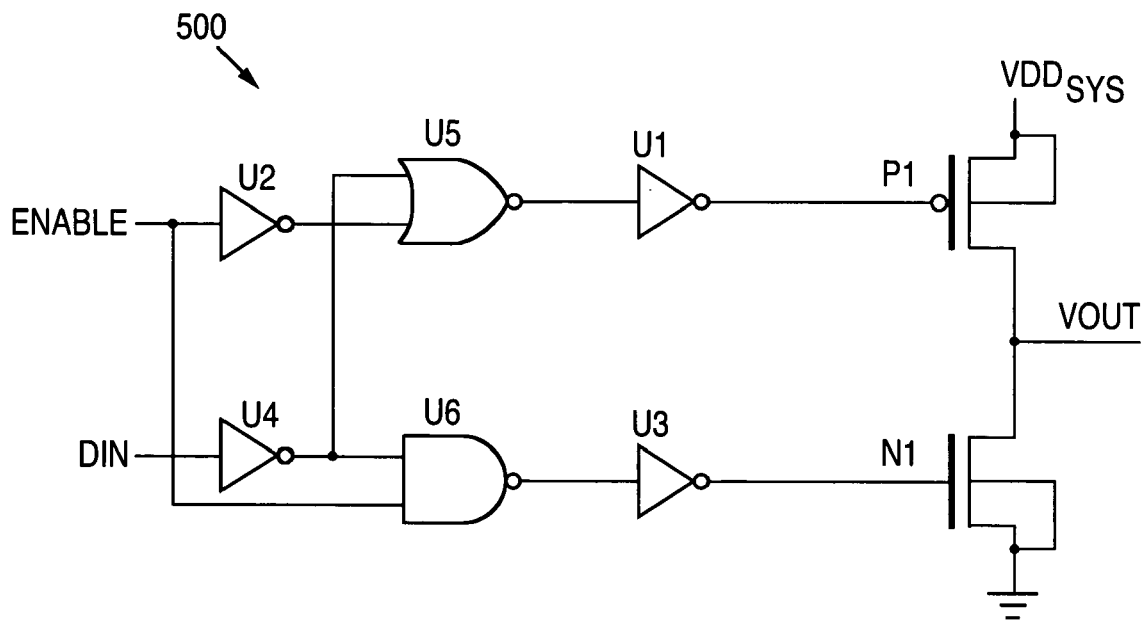
FIG. 5A is a schematic diagram illustrating an example of a prior-art non-inverting tristateable output buffer 500.
Figure 5B:
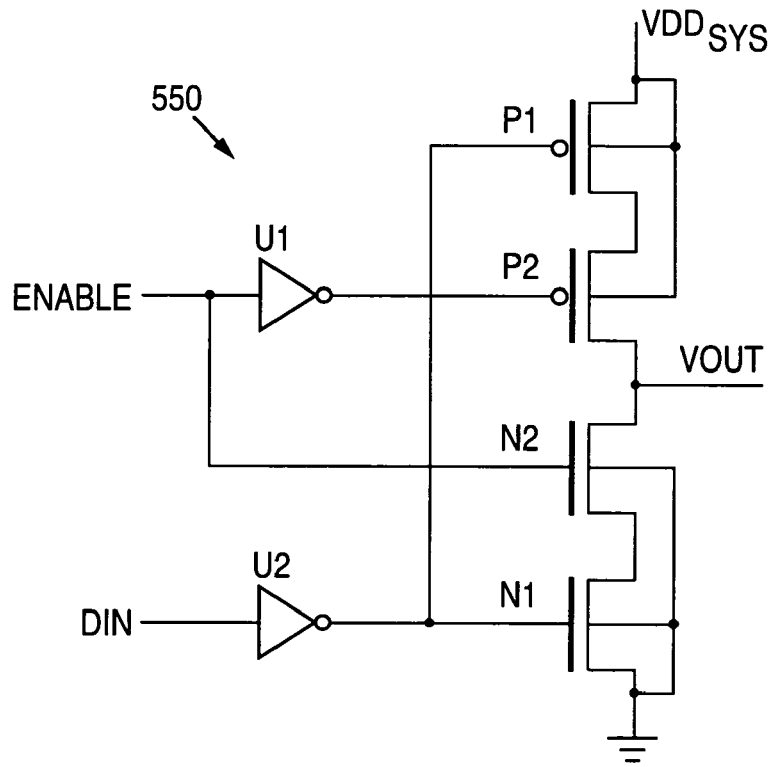
FIG. 5B is a schematic diagram illustrating an example of a prior-art non-inverting tristateable output buffer 550.
Figure 6:
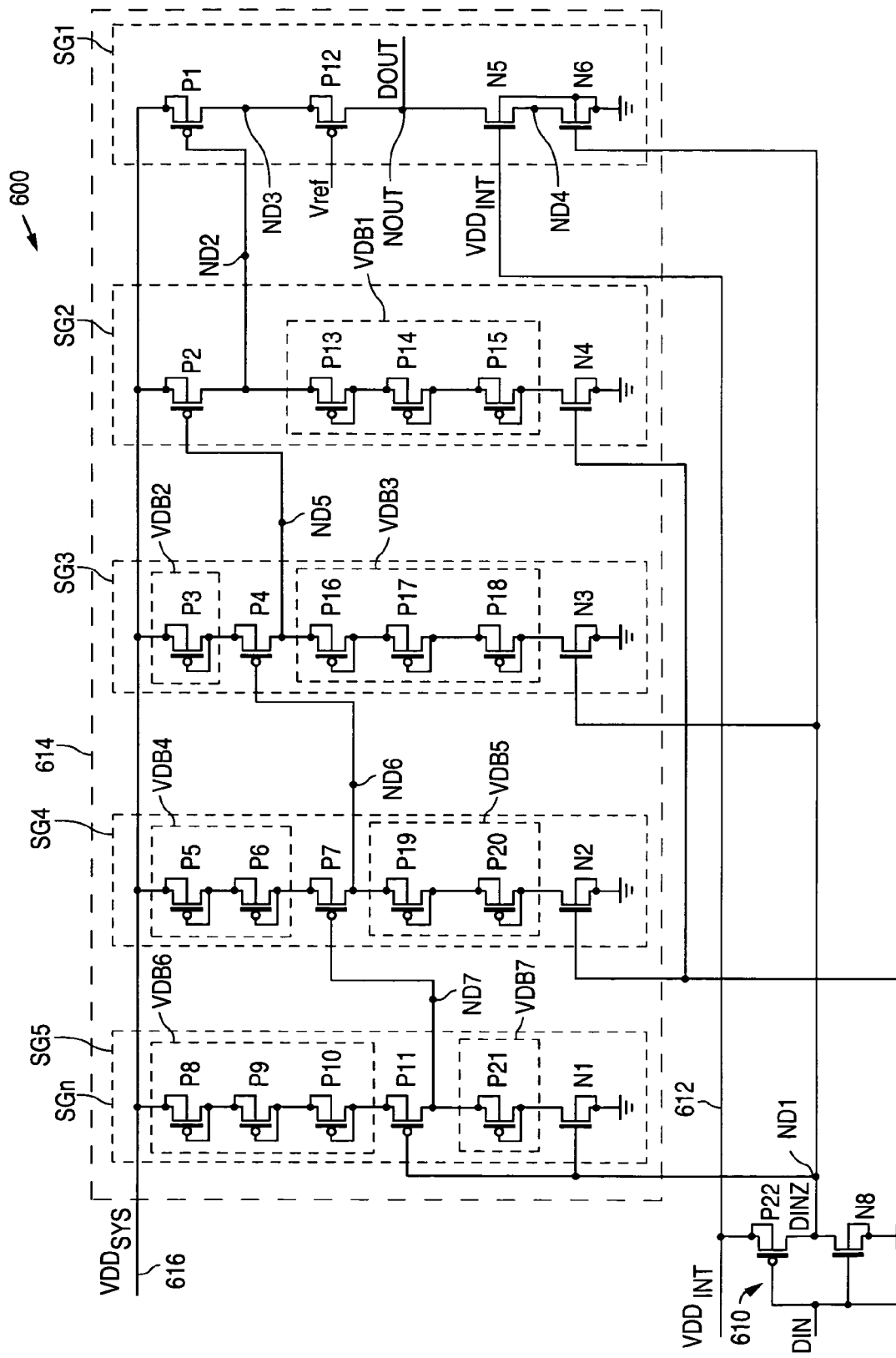
FIG. 6 is a schematic diagram illustrating an example of a high voltage output buffer 600, in accordance with the present invention.

In accordance with the present invention, FIG. 6 shows a schematic diagram that illustrates an example of a high voltage output buffer 600. As described in greater detail below, output buffer 600 can supply a high voltage output swing using only low voltage CMOS transistors. For example, output buffer 600 can supply a 5V output swing using only 3.3V CMOS transistors, or a 3.3V output swing using only 2.5V CMOS transistors.

As shown in FIG. 6, output buffer 600 includes an inverter 610 that inverts a low voltage input data signal DIN to generate a low voltage data output signal DINZ. Moreover, inverter 610 includes a PMOS transistor P22 and an NMOS transistor N8. Furthermore, PMOS transistor P22 has a gate connected to receive the low voltage input data signal DIN, a drain connected to an intermediate node ND1, and a source and substrate connected to an internal power supply line 612, which is connected to an internal power supply voltage $VDD_{INT}$. In addition, NMOS transistor N8 has a gate connected to receive the low voltage input data signal DIN, a drain connected to intermediate node ND1, and a source and substrate connected to ground.

As further shown in FIG. 6, output buffer 600 includes an inverting output driver 614 that inverts the low voltage input data signal DINZ, to generate a high voltage output signal DOUT. Moreover, output driver 614 and inverter 610 only employ low voltage CMOS transistors. In addition, inverting output driver 614 is composed of a series of inverter stages SG1-SGn which, in the present example, includes stages SG1, SG2, SG3, SG4 and SG5.

Referring to FIG. 6, inverter stage SG1 includes a PMOS transistor P1 and a PMOS transistor P12. PMOS transistor P1 has a gate connected to an intermediate node ND2, a drain connected to an intermediate node ND3, and a source and body connected to a system power supply line 616, which is connected to a system power supply voltage $VDD_{SYS}$. Furthermore, PMOS transistor P12 has a gate connected to receive a reference voltage Vref, a drain connected to the output node DOUT of buffer 600, and a source and body connected to intermediate node ND3.

In addition, inverter stage SG1 also includes an NMOS transistor N5 and an NMOS transistor N6. NMOS transistor N5 has a gate connected to internal power supply line 612, a drain connected to the output node DOUT of buffer 600, a source connected to an intermediate node ND4, and a body connected to ground. Furthermore, NMOS transistor N6 has a gate connected to intermediate node ND1, a drain connected to intermediate node ND4, and a source and body connected to ground.

Referring to FIG. 6, inverter stage SG2 includes a PMOS transistor P2, a voltage drop block VDB1, and an NMOS transistor N4. PMOS transistor P2 has a gate connected to an intermediate node ND5, a drain connected to the gate of PMOS transistor P1, and a source and body connected to system power supply line 616.

In the present example, voltage drop block VDB1 is implemented with three PMOS transistors P13, P14 and P15, but it can also be implemented with other devices, including devices that can collectively produce a total voltage drop equal to three PMOS thresholds. In addition, PMOS transistor P13 has a gate and a drain connected together, and a source and a body connected to the drain of PMOS transistor P2. Furthermore, PMOS transistor P14 has a gate and a drain connected together, and a source and a body connected to the drain of PMOS transistor P13. Moreover, PMOS transistor P15 has a gate and a drain connected together, and a source and a body connected to the drain of PMOS transistor P14. Finally, NMOS transistor N4 has a gate connected to receive the input data signal DIN, a drain connected to the drain of PMOS transistor P15, and a source and body connected to ground.

Referring to FIG. 6, inverter stage SG3 includes a voltage drop block VDB2, a PMOS transistor P4, a voltage drop block VDB3, and an NMOS transistor N3. In the present example, voltage drop block VDB2 is implemented with PMOS transistor P3, but it can also be implemented with other devices, including devices that can collectively produce a total voltage drop equal to one PMOS threshold.

As shown in FIG. 6, PMOS transistor P3 has a gate and a drain connected together, and a source and body connected to system power supply line 616. Furthermore, PMOS transistor P4 has a gate connected to an intermediate node ND6, a drain connected to the gate of PMOS transistor P2, and a source and body connected to the drain of PMOS transistor P3.

In the present example, voltage drop block VDB3 is implemented with PMOS transistors P16, P17 and P18, but it can also be implemented with other devices, including devices that can collectively produce a total voltage drop equal to three PMOS thresholds. In addition, PMOS transistor P16 has a gate and a drain connected together, and a source and body connected to the drain of PMOS transistor P4. Furthermore, PMOS transistor P17 has a gate and a drain connected together, and a source and body connected to the drain of PMOS transistor P16. Moreover, PMOS transistor P18 has a gate and a drain connected together, and a source and body connected to the drain of PMOS transistor P17. Finally, NMOS transistor N3 has a gate connected to intermediate node ND1, a drain connected to the drain of PMOS transistor P18, and a source and body connected to ground.

Referring to FIG. 6, inverter stage SG4 includes a voltage drop block VDB4, a PMOS transistor P7, a voltage drop block VDB5, and an NMOS transistor N2. In the present example, voltage drop block VDB4 is implemented with PMOS transistors P5 and P6, but it can also be implemented with other devices, including devices that can collectively produce a total voltage drop equal to two PMOS thresholds.

As shown in FIG. 6, PMOS transistor P5 has a gate and a drain connected together, and a source and body connected to system power supply line 616. In addition, PMOS transistor P6 has a gate and a drain connected together, and a source and body connected to the drain of PMOS transistor P5. Furthermore, PMOS transistor P7 has a gate connected to an intermediate node ND7, a drain connected to the gate of PMOS transistor P4, and a source and body connected to the drain of PMOS transistor P6.

In the present example, voltage drop block VDB5 is implemented with PMOS transistors P19 and P20, but it can also be implemented with other devices, including devices that can collectively produce a total voltage drop equal to two PMOS thresholds. In addition, PMOS transistor P19 has a gate and a drain connected together, and a source and body connected to the drain of PMOS transistor P7. Furthermore, PMOS transistor P20 has a gate and a drain connected together, and a source and body connected to the drain of PMOS transistor P19. Finally, NMOS transistor N2 has a gate connected to receive the input data signal DIN, a drain connected to the drain of PMOS transistor P20, and a source and body connected to ground.

Referring to FIG. 6, inverter stage SG5 includes a voltage drop block VDB6, a PMOS transistor P11, a voltage drop block VDB7, and an NMOS transistor N1. In the present example, voltage drop block VDB6 is implemented with PMOS transistors P8, P9 and P10, but it can also be implemented with other devices, including devices that can collectively produce a total voltage drop equal to three PMOS thresholds.

As shown in FIG. 6, PMOS transistor P8 has a gate and a drain connected together, and a source and body connected to system power supply line 616. In addition, PMOS transistor P9 has a gate and a drain connected together, and a source and body connected to the drain of PMOS transistor P8. Furthermore, PMOS transistor P10 has a gate and a drain connected together, and a source and body connected to the drain of PMOS transistor P9. Moreover, PMOS transistor P11 has a gate connected to intermediate node ND1, a drain connected to the gate of PMOS transistor P7, and a source and body connected to the drain of PMOS transistor P10.

In the present example, voltage drop block VDB7 is implemented with PMOS transistor P21, but it can also be implemented with other devices, including devices that can collectively produce a total voltage drop equal to one PMOS threshold. In addition, PMOS transistor P21 has a gate and a drain connected together, and a source and body connected to the drain of PMOS transistor P11. Moreover, NMOS transistor N1 has a gate connected to intermediate node ND1, a drain connected to the drain of PMOS transistor P21, and a source and body connected to ground.

During normal circuit operation, the active high input data signal DIN, and its complement DINZ, can both switch from ground (0V) to the internal power supply voltage $VDD_{INT}$, and vice versa. Thus, when the input data signal DIN is a logic high ($VDD_{INT}$) and its complement DINZ is a logic low (0V), PMOS transistor P22 will be turned off, and NMOS transistors N8, N2 and N4 will be turned on. Furthermore, PMOS transistor P11 will be turned on, and NMOS transistors N1, N3 and N6 will be turned off. Moreover, because PMOS transistor P11 is turned on and NMOS transistor N1 is turned off, PMOS transistor P11 will charge up the gate of PMOS transistor P7, turning transistor P7 off.

In addition, when PMOS transistor P7 is turned off and NMOS transistor N2 is turned on, NMOS transistor N2 will discharge the gate of PMOS transistor P4, turning on PMOS transistor P4. As a result, PMOS transistor P4 will charge up the gate of PMOS transistor P2, turning transistor P2 off.

Moreover, when PMOS transistor P2 is turned off and NMOS transistor N4 is turned on, NMOS transistor N4 will discharge the gate of PMOS transistor P1, turning on PMOS transistor P1. Thus, because PMOS transistor P1 is turned on, and PMOS transistor P12 is permanently turned on, and NMOS transistor N6 is turned off, PMOS transistor P1 will charge up the buffer output node DOUT to the system power supply voltage $VDD_{SYS}$.

Conversely, during normal circuit operation, when the input data signal DIN is a logic low (0V) and its complement DINZ is a logic high ($VDD_{INT}$), PMOS transistor P22 will be turned on, and NMOS transistors N8, N2 and N4 will be turned off. Furthermore, PMOS transistor P11 will be turned off, and NMOS transistors N1, N3 and N6 will be turned on. Moreover, because PMOS transistor P11 is turned off and NMOS transistor N1 is turned on, NMOS transistor N1 will discharge the gate of PMOS transistor P7, turning transistor P7 on.

In addition, when PMOS transistor P7 is turned on and NMOS transistor N2 is turned off, PMOS transistor P7 will charge up the gate of PMOS transistor P4, turning off PMOS transistor P4. As a result, NMOS transistor N3 will discharge the gate of PMOS transistor P2, turning transistor P2 on.

Moreover, when PMOS transistor P2 is turned on and NMOS transistor N4 is turned off, PMOS transistor P2 will charge up the gate of PMOS transistor P1, turning off PMOS transistor P1. Therefore, because PMOS transistor P1 is turned off and NMOS transistor N6 is turned on, and NMOS transistor N5 is permanently turned on, NMOS transistor N6 will discharge the buffer output node DOUT to the logic low level (0V).

In accordance with the present invention, the highest voltage applied to the gate of PMOS transistor P1 occurs when PMOS transistor P2 is turned on and NMOS transistor N4 is turned off. In this case, PMOS transistor P2 will charge up the gate of transistor P1 to the system power supply voltage $VDD_{SYS}$. Therefore, the gate-to-source voltage $V_{GS}$ of PMOS transistor P1 will be equal to $VDD_{SYS}-VDD_{SYS}=0V$. As a result, transistor P1 will be fully turned off and it will have very low leakage current.

Conversely, and in accordance with the present invention, the lowest voltage applied to the gate of PMOS transistor P1 occurs when PMOS transistor P2 is turned off and NMOS transistor N4 is turned on, causing the drain-to-source voltage of transistor N4 to equal 0V. As a result, NMOS transistor N4 will discharge the gate of PMOS transistor P1 to its lowest voltage level, which is defined by the voltage across voltage drop block VDB1.

Figure 7:
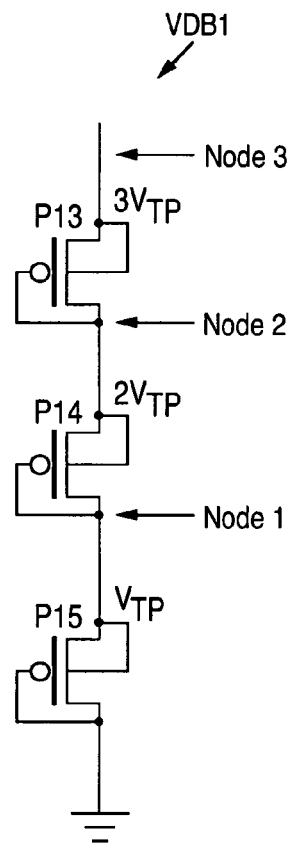
FIG. 7 is a schematic diagram illustrating an example of a voltage drop block VDB1, in accordance with the present invention.

In accordance with the present invention, FIG. 7 shows a schematic diagram that illustrates an example of voltage drop block VDB1. As shown in FIG. 7, each one of the three PMOS transistors P13, P14 and P15 is connected as a two terminal "diode". In other words, the transistor source is connected to the transistor body (N-well) to form a first terminal, and the transistor gate is connected to the transistor drain to form a second terminal. Furthermore, because these "diode-connected" PMOS transistors have their gates connected to their drains, all of these transistors are operating in saturated mode.

Moreover, because the sources of PMOS transistors P13, P14, and P15 are connected to their bodies, these transistors will not have any body effect. In other words, all three PMOS transistors will have the same threshold voltage, $V_{TP}$. Because of this, the voltage drop across each PMOS transistor will be equal to the PMOS threshold voltage, $V_{TP}$. Therefore, as shown in FIG. 7, the voltage at Node 1 is equal to $V_{TP}$, the voltage at Node 2 is equal to $2V_{TP}$, and the voltage at Node 3 is equal to $3V_{TP}$.

Thus, again referring to FIG. 6, when PMOS transistor P2 is turned off and NMOS transistor N4 is turned on, the lowest voltage on the gate of PMOS transistor P1 will be equal to $3V_{TP}$, which is the sum of the threshold voltages of PMOS transistors P13, P14 and P15. As a result, the lowest gate-to-source voltage $V_{GS}$ of PMOS transistor P1 will be equal to $3V_{TP}-VDD_{SYS}$.

Assuming that the system power supply voltage $VDD_{SYS}$ is equal to 5V, and that P1 is a 3.3V transistor, and that P1 has a threshold voltage $V_{TP}$ of 0.6V, the gate-to-source voltage of P1 will be equal to 1.8V−5V=−3.2V. Therefore, even though PMOS transistor P1 is connected to the 5V system power supply voltage $VDD_{SYS}$, the largest gate-to-source voltage $V_{GS}$ across transistor P1 is equal −3.2V. Furthermore, since a $V_{GS}$ of −3.2V is approximately equal to 5 PMOS thresholds (3.2V÷0.6V≈5), PMOS transistor P1 will be strongly turned on. In addition, since P1 is a 3.3V transistor, its gate oxide will not be damaged by a $V_{GS}$ of −3.2V.

Alternatively, assuming that the system power supply voltage $VDD_{SYS}$ is equal to 3.3V, and that P1 is a 2.5V transistor, and that P1 has a threshold voltage $V_{TP}$ of 0.4V, the gate-to-source voltage of P1 will be equal to 1.2V−3.3V=−2.1V. Therefore, even though PMOS transistor P1 is connected to the 3.3V system power supply voltage $VDD_{SYS}$, the largest gate-to-source voltage $V_{GS}$ across transistor P1 is equal −2.1V. Furthermore, since a $V_{GS}$ of −2.1V is approximately equal to 5 PMOS thresholds (2.1V÷0.4V≈5), PMOS transistor P1 will be strongly turned on. In addition, since P1 is a 2.5V transistor, its gate oxide will not be damaged by a $V_{GS}$ of −2.1V.

Referring to FIG. 6, the voltage on the output node DOUT of buffer 600 can be equal to 0V, or it can be equal to the system power supply voltage $VDD_{SYS}$. Therefore, it is not possible to use only one low voltage PMOS transistor, or only one low voltage NMOS transistor, in stage SG1 of output buffer 600. In other words, since the PMOS and NMOS transistors in stage SG1 are low voltage transistors, they cannot withstand the full system power supply voltage $VDD_{SYS}$ across their gate-to-source, gate-to-drain or drain-to-source terminals. Therefore, in order to avoid a transistor overvoltage condition, two cascoded low voltage PMOS transistors (P1 and P12) and two cascoded low voltage NMOS transistors (N5 and N6) are used in stage SG1 of buffer 600.

As shown in FIG. 6, a reference voltage Vref is placed on the gate of PMOS transistor P12, so that PMOS transistor P12 is always on. Thus, when PMOS transistor P1 is turned on, the drain-to source voltage of P12 will be equal to 0V, and, as required, the voltage on output node DOUT will be equal to the system power supply voltage $VDD_{SYS}$. As a result, the gate-to-drain voltage $V_{DG}$ (and the gate-to-source voltage $V_{GS}$) of transistor P12 will be equal to $Vref-VDD_{SYS}$. Therefore, in order to keep the $V_{DG}$ and $V_{GS}$ voltages of P12 within acceptable limits, the value of the reference voltage Vref must be properly chosen.

For example, assuming that $VDD_{SYS}$ is equal to 5V, and that $VDD_{INT}$ is equal to 3.3V, and that 3.3V transistors are being used, Vref could be set equal to 1.75V. In this case, the worst case $V_{GS}$ and $V_{GD}$ voltages for transistor P12 are both equal to 1.75V−5V=−3.25V, which is within the acceptable limits for 3.3V transistors.

Alternatively, assuming that $VDD_{SYS}$ is equal to 3.3V, and that $VDD_{INT}$ is equal to 2.5V, and that 2.5V transistors are being used, Vref could be set equal to 1.4V. In this case, the worst case $V_{GS}$ and $V_{GD}$ voltages for transistor P12 are both equal to 1.4V−2.5V=−1.1V, which is within the acceptable limits for 2.5V transistors. In addition, because the reference voltage Vref does not have to supply any current, the Vref voltage can be easily generated by an on-chip resistive voltage divider.

As shown in FIG. 6, the internal power supply voltage $VDD_{INT}$ is placed on the gate of NMOS transistor N5, so that NMOS transistor N5 is always on. Furthermore, when NMOS transistor N6 is turned off, the voltage on the output node DOUT of buffer 600 will be equal to the system power supply voltage $VDD_{SYS}$. Therefore, the gate-to-drain voltage $V_{GD}$ Of transistor N5 will be equal to $VDD_{INT}-VDD_{SYS}$. Furthermore, the gate-to-source voltage of transistor N5 will be equal to $VDD_{INT}-V_{TN}$, where $V_{TN}$ is equal to the NMOS transistor threshold voltage.

For example, assuming that $VDD_{SYS}$ is equal to 5V, and that $VDD_{INT}$ is equal to 3.3V, and that 3.3V transistors with a $V_{TN}$ (NMOS threshold) of 0.5V are being used, the gate-to-drain voltage $V_{GD}$ of transistor N5 will be equal to 3.3V−5V=−1.7V, which is within the acceptable limits for 3.3V transistors. Furthermore, when transistor N6 is turned off, the gate-to-source voltage of transistor N5 will be equal to 3.3V−0.5V=2.8V. Therefore, since a $V_{GS}$ of 2.8V is approximately equal to 6 NMOS thresholds (2.8V÷0.5V≈6), NMOS transistor N5 will be strongly turned on. In addition, since N5 is a 3.3V transistor, its gate oxide will not be damaged by a $V_{GS}$ of 2.8V.

Alternatively, assuming that $VDD_{SYS}$ is equal to 3.3V, and that $VDD_{INT}$ is equal to 2.5V, and that 2.5V transistors with a $V_{TN}$ (NMOS threshold) of 0.3V are being used, the gate-to-drain voltage $V_{GD}$ of transistor N5 will be equal to 2.5V−3.3V=−0.8V, which is within the acceptable limits for 2.5V transistors. Furthermore, when transistor N6 is turned off, the gate-to-source voltage of transistor N5 will be equal to 2.5V−0.3V=2.2V. Therefore, since a $V_{GS}$ of 2.2V is approximately equal to 7 NMOS thresholds (2.2V÷0.3V≈7), NMOS transistor N5 will be strongly turned on. In addition, since N5 is a 2.5V transistor, its gate oxide will not be damaged by a $V_{GS}$ of 2.2V.

Referring to FIG. 6, the highest gate voltage of NMOS transistor N6 occurs when PMOS transistor P22 is turned on and NMOS transistor N8 is turned off. In this case, PMOS transistor P22 charges up the gate of transistor N6 to the internal power supply voltage $VDD_{INT}$. As a result, the highest gate-to-source voltage $V_{GS}$ of transistor N6 is equal to $VDD_{INT}-0=VDD_{INT}$, which is within the acceptable limits for a 3.3V transistor, or a 2.5V transistor.

Furthermore, the highest drain-to-gate voltage of transistor N6 will occur when transistor N6 is turned off. In this case, the drain-to-gate voltage will be equal to $VDD_{INT}-V_{TN}$, which is within the acceptable limits for a 3.3V transistor, or a 2.5V transistor.

As noted above, transistors P12 and N5 both have DC voltages (Vref and $VDD_{INT}$ respectively) connected to their gates. Therefore, ideally speaking, these lower voltages should be applied to the chip before the higher system power supply voltage $VDD_{SYS}$ is applied. However, when this is not possible, the Vref and $VDD_{INT}$ voltages can be applied at the same time that $VDD_{SYS}$ is being applied. Alternatively, when this is not possible, the Vref and $VDD_{INT}$ voltages can be applied within a few milliseconds after $VDD_{SYS}$ has been applied. In this case, if $VDD_{SYS}$ and $VDD_{INT}$ are not too far apart, the output transistors will be stressed for only a few milliseconds, each time that power is applied to the chip. Thus, even if the chip is powered up many thousands of times during its lifetime, the cumulative stress on the gate oxide of the output transistors will not be significant.

In summary, and in accordance with the present invention, when the transistors in stage SG1 are 3.3V transistors and the system power supply voltage $VDD_{SYS}$ is equal to 5V, the maximum voltage across the gate oxide will be within acceptable limits for 3.3V transistors. Alternatively, when the transistors in stage SG1 are 2.5V transistors and the system power supply voltage $VDD_{SYS}$ is equal to 3.3V, the maximum voltage across the gate oxide will be within acceptable limits for 2.5V transistors. As a result, all of the transistors in stage SG1 can be implemented as low voltage transistors.

With regard to stage SG2, the highest gate voltage on PMOS transistor P2 occurs when PMOS transistor P4 is turned on and NMOS transistor N3 is turned off. In this case, PMOS transistor P4 will charge up the gate of PMOS transistor P2 to the system power supply voltage $VDD_{SYS}$ minus the voltage across voltage drop block VDB2. Furthermore, in the present example, the voltage across voltage drop block VDB2 is simply equal to the threshold voltage $V_{TP}$ of PMOS transistor P3. Therefore, the highest voltage on the gate of transistor P2 will be equal to $VDD_{SYS}-V_{TP}$. As a result, when the highest gate voltage on transistor P2 is present, the gate-to-source voltage $V_{GS}$ of P2 will be equal to $(VDD_{SYS}-V_{TP})-VDD_{SYS}=-V_{TP}$. Furthermore, in accordance with the present invention, and as illustrated in FIGS. 8A-8B, a gate-to-source voltage equal to $-V_{TP}$ is sufficient to turn off PMOS transistor P2.

Figure 8A:
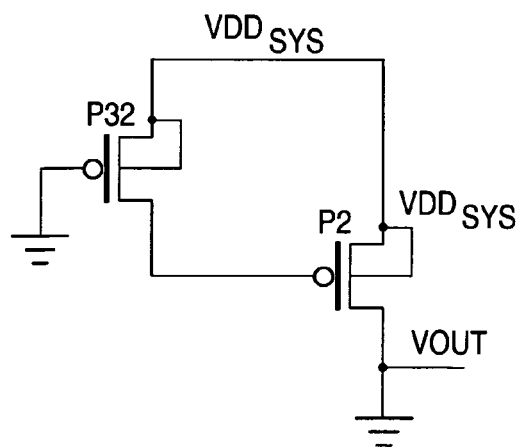
FIG. 8A is a schematic diagram illustrating a PMOS transistor P2 being turned off by a PMOS transistor P32, in accordance with the present invention.

In accordance with the present invention, FIG. 8A shows a schematic diagram that illustrates PMOS transistor P2 being turned off by a PMOS transistor P32. As shown in FIG. 8A, PMOS transistors P2 and P32 both have their source and body terminals connected to the system power supply voltage $VDD_{SYS}$. Furthermore, since the gate of PMOS transistor P32 is grounded, PMOS transistor P32 will be strongly on and its drain-to-source voltage will be equal to 0V. Because of this, the gate voltage of PMOS transistor P2 will be equal to the system power supply voltage $VDD_{SYS}$. Therefore, the gate-to-source voltage of PMOS transistor P2 will be equal to 0V, and PMOS transistor P2 will be turned off.

Figure 8B:
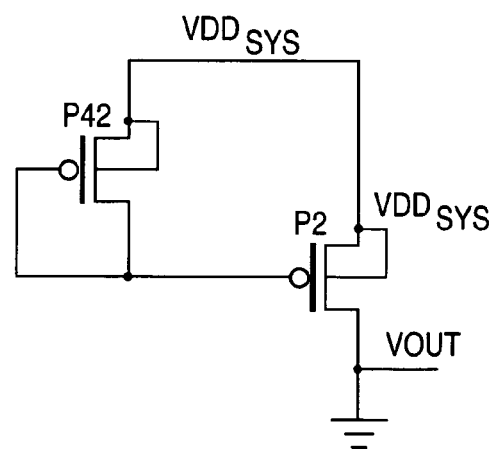
FIG. 8B is a schematic diagram illustrating a PMOS transistor P2 being turned off by a PMOS transistor P42, in accordance with the present invention.

In accordance with the present invention, FIG. 8B shows a schematic diagram that illustrates PMOS transistor P2 being turned off by a PMOS transistor P42. As shown in FIG. 8B, PMOS transistors P2 and P42 both have their source and body terminals connected to the system power supply voltage $VDD_{SYS}$. However, in contrast to the circuit shown in FIG. 8A, the gate of PMOS transistor P42 is not grounded in FIG. 8B, but is instead connected to the drain of PMOS transistor P42. Therefore, PMOS transistor P2 is connected as a diode. As a result, the voltage that is present on the gate of PMOS transistor P2 is equal to $VDD_{SYS}-V_{TP}$. Therefore, the gate-to-source voltage of PMOS transistor P2 will be equal to $(VDD_{SYS}-V_{TP})-VDD_{SYS}=-V_{TP}$. Thus, except for a minuscule amount of sub-threshold leakage current, PMOS transistor P2 will be turned off.

Furthermore, when the chip temperature is changed, the threshold voltages of PMOS transistors P2 and P42 will both change. However, since P2 and P42 are both PMOS transistors, their thresholds will change by the same amount. In other words, the threshold voltages of P2 and P42 will track each other as the temperature is changed. As a consequence of this, transistor P2 will remain turned off under all circuit conditions.

Again referring to FIG. 6, the lowest voltage applied to the gate of PMOS transistor P2 occurs when PMOS transistor P4 is turned off and NMOS transistor N3 is turned on. In this case, NMOS transistor N3 will pull down the voltage on the gate of PMOS transistor P2. As a result, the lowest voltage on the gate of PMOS transistor P2 is defined by the voltage across voltage drop block VDB3. Furthermore, in the present example, the voltage across voltage drop block VDB3 is equal $-3V_{TP}$, which is equal to the sum of the threshold voltages $V_{TP}$ of the three PMOS transistors P16, P17 and P18. Therefore, the lowest voltage on the gate of PMOS transistor P2 will be equal to $3V_{TP}$. As a result, when the lowest gate voltage on P2 is present, the gate-to-source voltage $V_{GS}$ of P2 will be equal to $3V_{TP}-VDD_{SYS}$.

A gate-to-source voltage of $3V_{TP}-VDD_{SYS}$ is high enough to turn on PMOS transistor P2, but not high enough to damage the gate oxide of P2. For example, assuming that $VDD_{SYS}$ is equal to 5V, and that 3.3V transistors with a $V_{TP}$ (PMOS threshold) of 0.6V are being used, the gate-to-source voltage $V_{GS}$ of transistor P2 will be equal to 1.8V-5V=-3.2V. Furthermore, since a $V_{GS}$ of -3.2V is approximately equal to 5 PMOS thresholds (2.3V÷0.6V≈5), PMOS transistor P2 will be strongly turned on. In addition, since P2 is a 3.3V transistor, its gate oxide will not be damaged by a $V_{GS}$ of -3.2V.

Alternatively, assuming that $VDD_{SYS}$ is equal to 3.3V, and that 2.5V transistors with a $V_{TP}$ (PMOS threshold) of 0.4V are being used, the gate-to-source voltage $V_{GS}$ of transistor P2 will be equal to 1.2V-3.3V=-2.1V. Furthermore, since a $V_{GS}$ of -2.1V is approximately equal to 5 PMOS thresholds (2.1V÷0.4V≈5), PMOS transistor P2 will be strongly turned on. In addition, since P2 is a 2.5V transistor, its gate oxide will not be damaged by a $V_{GS}$ of -2.1V.

With regard to the diode connected PMOS transistors P13, P14 and P15 in voltage drop block VDB1, these transistors never conduct DC current. As a result, the maximum voltage drop across each diode connected transistor will be equal to one PMOS threshold voltage, $V_{TP}$. Therefore, each of the PMOS transistors P13, P14 and P15 can be implemented as a low voltage PMOS transistor.

As shown in FIG. 6, the data input signal DIN is connected to the gate terminal of NMOS transistor N4. Thus, when DIN is low (0V), the gate voltage of transistor N4 will be equal to 0V, and transistor N4 will be turned off. Furthermore, when transistor N4 is turned off and transistor P2 is turned on, the voltage on the drain of NMOS transistor N4 will be equal to the system power supply voltage $VDD_{SYS}$ minus the voltage across voltage drop block VDB1. Therefore, since the voltage across voltage drop block VDB1 is equal to $3V_{TP}$, the highest drain-to-gate voltage $V_{DG}$ of N4 will be equal to $VDD_{SYS}-3V_{TP}$.

Assuming that $VDD_{SYS}$ is equal to 5V, and that 3.3V transistors with a $V_{TP}$ (PMOS threshold) of 0.6V are being used, the drain-to-gate voltage $V_{DG}$ of transistor N4 will be equal to 5V-1.8V=2.3V. This is within acceptable limits for 3.3V transistors. Alternatively, assuming that $VDD_{SYS}$ is equal to 3.3V, and that 2.5V transistors with a $V_{TP}$ (PMOS threshold) of 0.4V are being used, the drain-to-gate voltage $V_{DG}$ of transistor N4 will be equal to 3.3V-1.2V=2.1V. This is also within acceptable limits for 3.3V transistors.

In summary, when the transistors in stage SG2 are 3.3V transistors and the system power supply voltage $VDD_{SYS}$ is equal to 5V, the voltage across the gate oxide will remain within acceptable limits. Furthermore, when the transistors in stage SG2 are 2.5V transistors and the system power supply voltage $VDD_{SYS}$ is equal to 3.3V, the voltage across the gate oxide will also remain within acceptable limits. As a result, all of the transistors in stage SG2 can be implemented as low voltage transistors.

With regard to stage SG3, the highest gate voltage on PMOS transistor P4 occurs when PMOS transistor P7 is turned on and NMOS transistor N2 is turned off. In this case, PMOS transistor P7 will charge up the gate of PMOS transistor P4 to the system power supply voltage $VDD_{SYS}$ minus the voltage across voltage drop block VDB4. Furthermore, in the present example, the voltage across voltage drop block VDB4 is equal to the threshold voltages $V_{TP}$ of PMOS transistors P5 and P6. Therefore, the highest voltage on the gate of transistor P4 will be equal to $VDD_{SYS}-2V_{TP}$. As a result, when the highest gate voltage on transistor P4 is present, the gate-to-source voltage $V_{GS}$ of PMOS transistor P4 will be equal to $(VDD_{SYS}-2V_{TP})-(VDD_{SYS}-V_{TP})=-V_{TP}$. Furthermore, as previously described, and in accordance with the present invention, a gate-to-source voltage of $-V_{TP}$ is sufficient to turn off PMOS transistor P4.

Again referring to FIG. 6, the lowest gate voltage on PMOS transistor P4 occurs when PMOS transistor P7 is turned off and NMOS transistor N2 is turned on. In this case, NMOS transistor N2 will pull down the voltage on the gate of PMOS transistor P4. As a result, the lowest voltage on the gate of PMOS transistor P4 is defined by the voltage across voltage drop block VDB5. Furthermore, in the present example, the voltage across voltage drop block VDB5 is equal to the sum of the threshold voltages $V_{TP}$ of two PMOS transistors P19 and P20. Therefore, the lowest voltage on the gate of PMOS transistor P4 will be equal to $2V_{TP}$. As a result, when the lowest gate voltage on P4 is present, the gate-to-source voltage $V_{GS}$ of P4 will be equal to $2V_{TP}-(VDD_{SYS}-V_{TP})=3V_{TP}-VDD_{SYS}$.

A gate-to-source voltage of $3V_{TP}-VDD_{SYS}$ is high enough to turn on PMOS transistor P4, but not high enough to damage the gate oxide of P4. For example, assuming that $VDD_{SYS}$ is equal to 5V, and that 3.3V transistors with a $V_{TP}$ (PMOS threshold) of 0.6V are being used, the gate-to-source voltage $V_{GS}$ of transistor P4 will be equal to 1.8V-5V=-3.2V. Furthermore, since a $V_{GS}$ of -3.2V is approximately equal to 5 PMOS thresholds (2.3V÷0.6V≈5), PMOS transistor P4 will be strongly turned on. In addition, since P4 is a 3.3V transistor, its gate oxide will not be damaged by a $V_{GS}$ of -3.2V.

Alternatively, assuming that $VDD_{SYS}$ is equal to 3.3V, and that 2.5V transistors with a $V_{TP}$ (PMOS threshold) of 0.4V are being used, the gate-to-source voltage $V_{GS}$ of transistor P4 will be equal to 1.2V−3.3V=−2.1V. Furthermore, since a $V_{GS}$ of −2.1V is approximately equal to 5 PMOS thresholds (2.1V÷0.4V≈5), PMOS transistor P4 will be strongly turned on. In addition, since P4 is a 2.5V transistor, its gate oxide will not be damaged by a $V_{GS}$ of −2.1V.

With regard to the diode connected PMOS transistors P16, P17 and P18 in voltage drop block VDB3, these transistors never conduct DC current. As a result, the maximum voltage drop across each diode connected transistor will be equal to one PMOS threshold drop, $V_{TP}$. Therefore, each one of the PMOS transistors P16, P17 and P18 can be implemented as a low voltage PMOS transistor.

As shown in FIG. 6, the data input signal DINZ is connected to the gate terminal of NMOS transistor N3. Thus, when DINZ is low (0V), the gate voltage of transistor N3 will be equal to 0V, and transistor N3 will be turned off. Furthermore, when transistor N3 is turned off and transistor P4 is turned on, the voltage on the drain of NMOS transistor N3 will be equal to the system power supply voltage $VDD_{SYS}$ minus the voltage across voltage drop block VDB2, minus the voltage across voltage drop block VDB3. Therefore, since the total voltage across voltage drop blocks VDB2 and VDB3 is equal to $V_{TP}+3V_{TP}=4V_{TP}$, the highest drain-to-gate voltage $V_{DG}$ of N3 will be equal to $VDD_{SYS}-4V_{TP}$.

Assuming that $VDD_{SYS}$ is equal to 5V, and that 3.3V transistors with a $V_{TP}$ (PMOS threshold) of 0.6V are being used, the drain-to-gate voltage $V_{DG}$ of transistor N3 will be equal to 5V−2.4V=2.6V. This is within acceptable limits for 3.3V transistors. Alternatively, assuming that $VDD_{SYS}$ is equal to 3.3V, and that 2.5V transistors with a $V_{TP}$ (PMOS threshold) of 0.4V are being used, the drain-to-gate voltage $V_{DG}$ of transistor N3 will be equal to 3.3V−1.6V=1.7V. This is also within acceptable limits for 3.3V transistors.

In summary, when the transistors in stage SG3 are 3.3V transistors and the system power supply voltage $VDD_{SYS}$ is equal to 5V, the voltage across the gate oxide will remain within acceptable limits. Furthermore, when the transistors in stage SG3 are 2.5V transistors and the system power supply voltage $VDD_{SYS}$ is equal to 3.3V, the voltage across the gate oxide will also remain within acceptable limits. As a result, all of the transistors in stage SG3 can be implemented as low voltage transistors.

With regard to stage SG4, the highest gate voltage on PMOS transistor P7 occurs when PMOS transistor P11 is turned on and NMOS transistor N1 is turned off. In this case, PMOS transistor P11 will charge up the gate of PMOS transistor P7 to the system power supply voltage $VDD_{SYS}$ minus the voltage across voltage drop block VDB6. Furthermore, in the present example, the voltage across voltage drop block VDB6 is equal to the threshold voltages $V_{TP}$ of PMOS transistors P8, P9 and P10. Therefore, the highest voltage on the gate of transistor P7 will be equal to $VDD_{SYS}-3V_{TP}$. As a result, when the highest gate voltage on transistor P7 is present, the gate-to-source voltage $V_{GS}$ of PMOS transistor P7 will be equal to $(VDD_{SYS}-3V_{TP})-(VDD_{SYS}-2V_{TP})=-V_{TP}$. Furthermore, as previously described, and in accordance with the present invention, a gate-to-source voltage of $-V_{TP}$ is sufficient to turn off PMOS transistor P7.

Again referring to FIG. 6, the lowest gate voltage on PMOS transistor P7 occurs when PMOS transistor P11 is turned off and NMOS transistor N1 is turned on. In this case, NMOS transistor N1 will pull down the voltage on the gate of PMOS transistor P7. As a result, the lowest voltage on the gate of PMOS transistor P7 is defined by the voltage across voltage drop block VDB7. Furthermore, in the present example, the voltage across voltage drop block VDB7 is simply equal to the threshold voltage $V_{TP}$ of PMOS transistor P21. Therefore, the lowest voltage on the gate of PMOS transistor P7 will be equal to $V_{TP}$. As a result, when the lowest gate voltage on P7 is present, the gate-to-source voltage $V_{GS}$ of P7 will be equal to $V_{TP}-(VDD_{SYS}-2V_{TP})=3V_{TP}-VDD_{SYS}$.

A gate-to-source voltage of $3V_{TP}-VDD_{SYS}$ is high enough to turn on PMOS transistor P7, but not high enough to damage the gate oxide of P7. For example, assuming that $VDD_{SYS}$ is equal to 5V, and that 3.3V transistors with a $V_{TP}$ (PMOS threshold) of 0.6V are being used, the gate-to-source voltage $V_{GS}$ of transistor P7 will be equal to 1.8V−5V=−3.2V. Furthermore, since a $V_{GS}$ of −3.2V is approximately equal to 5 PMOS thresholds (3.2V÷0.6V≈5), PMOS transistor P7 will be strongly turned on. In addition, since P7 is a 3.3V transistor, its gate oxide will not be damaged by a $V_{GS}$ of −3.2V.

Alternatively, assuming that $VDD_{SYS}$ is equal to 3.3V, and that 2.5V transistors with a $V_{TP}$ (PMOS threshold) of 0.4V are being used, the gate-to-source voltage $V_{GS}$ of transistor P7 will be equal to 1.2V−3.3V=−2.1V. Furthermore, since a $V_{GS}$ of −2.1V is approximately equal to 5 PMOS thresholds (2.1V÷0.4V≈5), PMOS transistor P7 will be strongly turned on. In addition, since P7 is a 2.5V transistor, its gate oxide will not be damaged by a $V_{GS}$ of −2.1V.

With regard to the diode connected PMOS transistors in voltage drop blocks VDB4 and VDB5, these transistors never conduct DC current. As a result, the maximum voltage drop across each diode connected transistor will be equal to one PMOS threshold drop, $V_{TP}$. Therefore, each one of the PMOS transistors in voltage drop blocks VDB4 and VDB5 can be implemented as a low voltage PMOS transistor.

As shown in FIG. 6, the data input signal DIN is connected to the gate terminal of NMOS transistor N2. Thus, when DIN is low (0V), the gate voltage of transistor N2 will be equal to 0V, and transistor N2 will be turned off. Furthermore, when transistor N2 is turned off and transistor P7 is turned on, the voltage on the drain of NMOS transistor N2 will be equal to the system power supply voltage $VDD_{SYS}$ minus the voltage across voltage drop block VDB4, minus the voltage across voltage drop block VDB5. Therefore, since the voltage across voltage these voltage drop blocks is equal to $2V_{TP}+2V_{TP}=4V_{TP}$, the highest drain-to-gate voltage $V_{DG}$ of N4 will be equal to $VDD_{SYS}-4V_{TP}$.

Assuming that $VDD_{SYS}$ is equal to 5V, and that 3.3V transistors with a $V_{TP}$ (PMOS threshold) of 0.6V are being used, the drain-to-gate voltage $V_{DG}$ of transistor N2 will be equal to 5V−2.4V=2.6V. This is within acceptable limits for 3.3V transistors. Alternatively, assuming that $VDD_{SYS}$ is equal to 3.3V, and that 2.5V transistors with a $V_{TP}$ (PMOS threshold) of 0.4V are being used, the drain-to-gate voltage $V_{DG}$ of transistor N2 will be equal to 3.3V−1.6V=1.7V. This is also within acceptable limits for 3.3V transistors.

In summary, when the transistors in stage SG4 are 3.3V transistors and the system power supply voltage $VDD_{SYS}$ is equal to 5V, the voltage across the gate oxide will remain within acceptable limits. Furthermore, when the transistors in stage SG4 are 2.5V transistors and the system power supply voltage $VDD_{SYS}$ is equal to 3.3V, the voltage across the gate oxide will also remain within acceptable limits. As a result, all of the transistors in stage SG4 can be implemented as low voltage transistors.

With regard to stage SG5, the highest gate voltage on PMOS transistor P11 occurs when PMOS transistor P22 is turned on and NMOS transistor N1 is turned off. In this case, PMOS transistor P22 will charge up the gate of PMOS transistor P11 to the internal power supply voltage $VDD_{INT}$. Therefore, the highest voltage on the gate of transistor P11 will be equal to $VDD_{INT}$. Furthermore, the source voltage of PMOS transistor P11 is defined by the $VDD_{SYS}$ voltage minus the voltage across voltage drop block VDB6. However, in the present example, the voltage across voltage drop block VDB6 is equal to the threshold voltages $V_{TP}$ of PMOS transistors P8, P9 and P10. As a result, the source voltage of PMOS transistor P11 will be equal to $VDD_{SYS}-3V_{TP}$. Thus, when the highest gate voltage on transistor P11 is present, the gate-to-source voltage $V_{GS}$ of PMOS transistor P11 will be equal to $VDD_{INT}-(VDD_{SYS}-3V_{TP})=-VDD_{SYS}+VDD_{INT}+3V_{TP}$.

Assuming that $VDD_{SYS}$ is equal to 5V, and that 3.3V transistors with a $V_{TP}$ (PMOS threshold) of 0.6V are being used, the highest gate-to-source voltage $V_{GS}$ of transistor P11 will be equal to $-5V+3.3V+1.8V=+0.1V$. Since this gate-to-source voltage has a positive value, it will strongly turn off PMOS transistor P11.

Alternatively, assuming that $VDD_{SYS}$ is equal to 3.3V, and that 2.5V transistors with a $V_{TP}$ (PMOS threshold) of 0.4V are being used, the gate-to-source voltage $V_{GS}$ of transistor P11 will be equal to $-3.3V+2.5V+1.2V=+0.4V$. Since this gate-to-source voltage has a positive value, it will strongly turn off PMOS transistor P11.

Again referring to FIG. 6, the lowest gate voltage on PMOS transistor P11 occurs when PMOS transistor P22 is turned off and NMOS transistor N8 is turned on. In this case, NMOS transistor N8 will pull down the voltage on the gate of PMOS transistor P11 to 0V (GND). Furthermore, the source voltage on PMOS transistor P11 is defined by the $VDD_{SYS}$ voltage minus the voltage across voltage drop block VDB6. However, in the present example, the voltage across voltage drop block VDB6 is equal to the threshold voltages $V_{TP}$ of PMOS transistors P8, P9 and P10. As a result, the source voltage of PMOS transistor P11 will be equal to $VDD_{SYS}-3V_{TP}$. Thus, when the lowest gate voltage on transistor P11 is present, the gate-to-source voltage $V_{GS}$ of PMOS transistor P11 will be equal to $0V-(VDD_{SYS}-3V_{TP})=3V_{TP}-VDD_{SYS}$.

A gate-to-source voltage of $3V_{TP}-VDD_{SYS}$ is high enough to turn on PMOS transistor P11, but not high enough to damage the gate oxide of P11. For example, assuming that $VDD_{SYS}$ is equal to 5V, and that 3.3V transistors with a $V_{TP}$ (PMOS threshold) of 0.6V are being used, the gate-to-source voltage $V_{GS}$ of transistor P11 will be equal to $1.8V-5V=-3.2V$. Furthermore, since a $V_{GS}$ of $-3.2V$ is approximately equal to 5 PMOS thresholds ($2.3V \div 0.6V \approx 5$), PMOS transistor P11 will be strongly turned on. In addition, since P11 is a 3.3V transistor, its gate oxide will not be damaged by a $V_{GS}$ of $-3.2V$.

Alternatively, assuming that $VDD_{SYS}$ is equal to 3.3V, and that 2.5V transistors with a $V_{TP}$ (PMOS threshold) of 0.4V are being used, the gate-to-source voltage $V_{GS}$ of transistor P11 will be equal to $1.2V-3.3V=-2.1V$. Furthermore, since a $V_{GS}$ of $-2.1V$ is approximately equal to 5 PMOS thresholds ($2.1V \div 0.4V \approx 5$), PMOS transistor P11 will be strongly turned on. In addition, since P11 is a 2.5V transistor, its gate oxide will not be damaged by a $V_{GS}$ of $-2.1V$.

With regard to the diode connected PMOS transistors P8, P9 and P10 in voltage drop block VDB6, these transistors never conduct DC current. As a result, the maximum voltage drop across each diode connected transistor will be equal to one PMOS threshold drop, $V_{TP}$. Therefore, each one of the PMOS transistors P8, P9 and P10 can be implemented as a low voltage PMOS transistor.

As shown in FIG. 6, the data input signal DINZ is connected to the gate terminal of NMOS transistor N1. Thus, when DINZ is low (0V), the gate voltage of transistor N1 will be equal to 0V, and transistor N1 will be turned off. Furthermore, when transistor N1 is turned off and transistor P11 is turned on, the voltage on the drain of NMOS transistor N1 will be equal to the system power supply voltage $VDD_{SYS}$ minus the voltage across voltage drop block VDB6, minus the voltage across voltage drop block VDB7. Therefore, since the voltage across voltage these voltage drop blocks is equal to $3V_{TP}+1V_{TP}=4V_{TP}$, the highest drain-to-gate voltage $V_{DG}$ of N1 will be equal to $VDD_{SYS}-4V_{TP}$.

Assuming that $VDD_{SYS}$ is equal to 5V, and that 3.3V transistors with a $V_{TP}$ (PMOS threshold) of 0.6V are being used, the drain-to-gate voltage $V_{DG}$ of transistor N1 will be equal to $5V-2.4V=2.6V$. This is within acceptable limits for 3.3V transistors. Alternatively, assuming that $VDD_{SYS}$ is equal to 3.3V, and that 2.5V transistors with a $V_{TP}$ (PMOS threshold) of 0.4V are being used, the drain-to-gate voltage $V_{DG}$ of transistor N1 will be equal to $3.3V-1.6V=1.7V$. This is also within acceptable limits for 3.3V transistors.

In summary, when the transistors in stage SG5 are 3.3V transistors and the system power supply voltage $VDD_{SYS}$ is equal to 5V, the voltage across the gate oxide will remain within acceptable limits. Furthermore, when the transistors in stage SG5 are 2.5V transistors and the system power supply voltage $VDD_{SYS}$ is equal to 3.3V, the voltage across the gate oxide will also remain within acceptable limits. As a result, all of the transistors in stage SG5 can be implemented as low voltage transistors.

As shown in FIG. 6, each stage SG1-SGn includes only one PMOS transistor and one NMOS transistor that can be fully switched on/off. For example, the fully switched PMOS transistors in stages SG1-SG5 include P1, P2, P4, P7 and P11, respectively. In addition, the fully switched NMOS transistors in stages SG1-SG5 include N6, N4, N3, N2 and N1, respectively. Furthermore, both of the fully switched PMOS and NMOS transistors in any given stage cannot be in a turned-on state at the same time. Using stage SG2 as an example, if PMOS transistor P2 is turned off, NMOS transistor N4 will be turned on, and vice versa.

Again using stage SG2 as an example, if PMOS transistor P2 remains turned off for a very long time, NMOS transistor N4 will remain turned on for very a long time. Therefore, under this circuit condition, the exceedingly small DC leakage current through PMOS transistors P13, P14 and P15 could eventually discharge the gate of PMOS transistor P1 to ground (0V). Moreover, if this condition were to occur, the gate-to-source voltage $V_{GS}$ of transistor P1 would eventually become equal to $VDD_{SYS}$, exceeding the maximum allowed $V_{GS}$ for P1. Thus, in order to prevent this circuit condition from occurring, a high value resistor R2 can be connected from the drain of transistor P2 to a reference voltage such as $VDD_{INT}$, as shown in FIG. 9.

Figure 9:
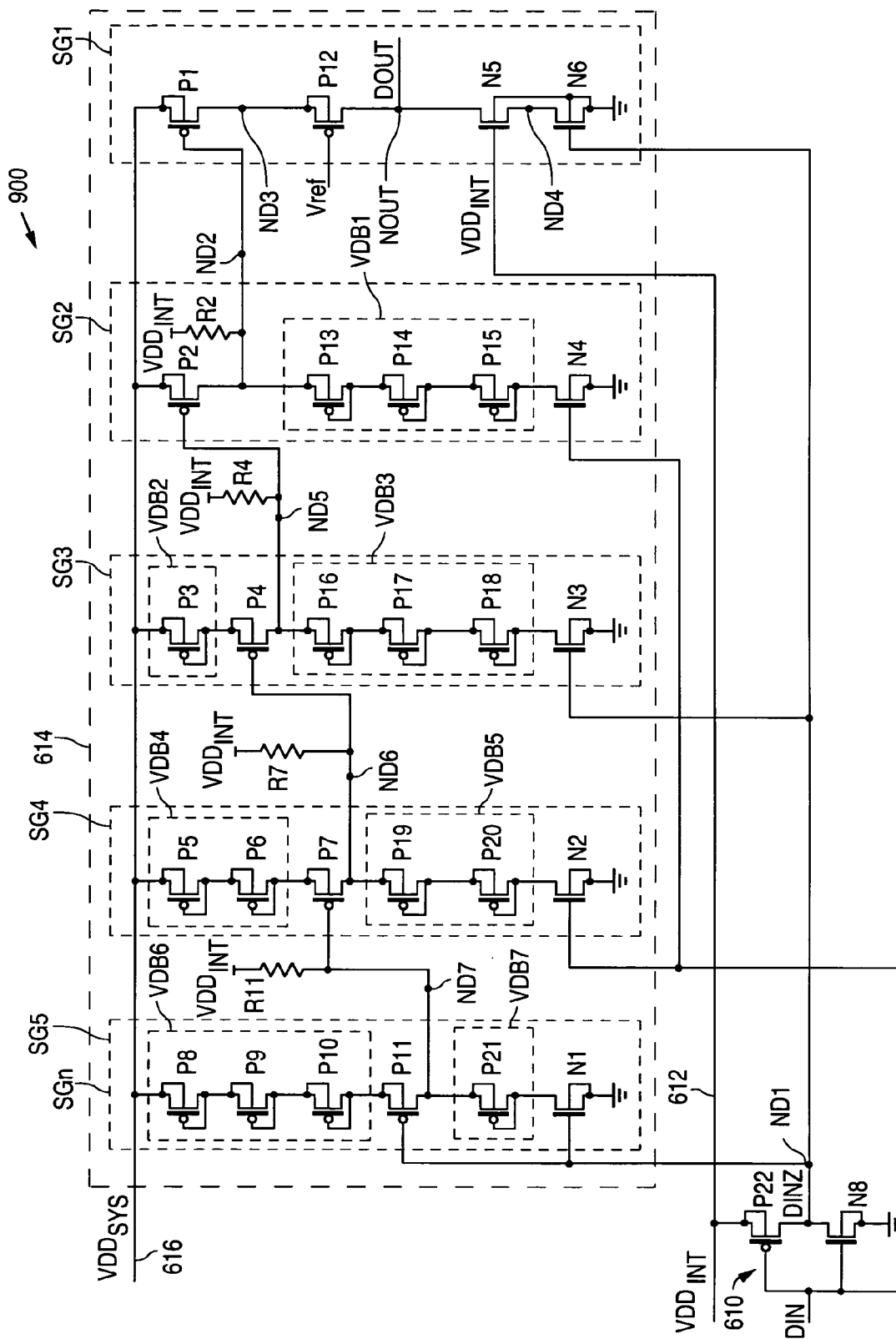
FIG. 9 is a schematic diagram illustrating an example of a high voltage output buffer 900, in accordance with the present invention.

In accordance with the present invention, FIG. 9 shows a schematic diagram that illustrates an example of a high voltage output buffer 900. Buffer 900 is similar to buffer 600, and as a result, utilizes the same reference numerals to designate the structures that are common to both buffers. Comparing buffer 900 in FIG. 9 to buffer 600 in FIG. 6, it can be seen that both figures are identical, except that high value resistors R2, R4, R7 and R11 have been added to FIG. 9.

Referring to FIG. 9, the purpose of high value resistor R2, which is connected between the internal power supply voltage $VDD_{INT}$ and the drain of transistor P2, is to cancel out the leakage current at the drain of PMOS transistor P2. In other words, this leakage current cancellation will cause the drain voltage of PMOS transistor P2 to remain at a voltage level of $3V_{TP}$ above ground, even when PMOS transistor P2 remains turned off for a very long time, and NMOS transistor N4 remains turned on for a very long time.

Similarly, high value resistor R4, which is connected between the internal power supply voltage $VDD_{INT}$ and the drain of transistor P4, is used to cancel out the leakage current at the drain of PMOS transistor P4. Furthermore, high value resistor R7, which is connected between the internal power supply voltage $VDD_{INT}$ and the drain of transistor P7, is used to cancel out the leakage current at the drain of PMOS transistor P7. In addition, high value resistor R11, which is connected between the internal power supply voltage $VDD_{INT}$ and the drain of transistor P11, is used to cancel out the leakage current at the drain of PMOS transistor P11. Moreover, since resistors R2, R4, R7 and R11 have a high value in comparison to the equivalent turned-on resistances of PMOS transistors P2, P4, P7 and P11, resistors R2, R4, R7 and R11 will not affect the drain voltages of PMOS transistors P2, P4, P7 and P11, when these PMOS transistors are in a turned-on state.

Furthermore, the average power dissipation in resistors R2, R4, R7 and R11 will be very low for two reasons. First of all, these resistors only dissipate power when NMOS transistors N4, N3, N2 and N1 are in a turned-on state. Secondly, when power is being dissipated, it will be exceedingly low because resistors R2, R4, R7 and R11 are high in value.

Referring to Table 1, when the switched PMOS transistors P2, P4 and P7 in stages SG2-SG4 are turned off, their gate-to-source voltage $V_{GS}$ will be the same: $-V_{TP}$. Therefore, as described above, this voltage level is adequate to turn off these transistors.

Again referring to Table 1, when switched PMOS transistor P11 in stage SG5 is turned off, its "off" gate-to-source voltage $V_{GS}$ will be equal to $VDD_{INT}+3V_{TP}-VDD_{SYS}$. Thus, assuming that $VDD_{SYS}$ is equal to 5V, and that $VDD_{INT}$ is equal to 3.3V, and that 3.3V transistors with a $V_{TP}$ (PMOS threshold) of 0.6V are being used, the "off" $V_{GS}$ voltage of transistor P11 will be equal to 3.3V+1.8V−5V=+0.1V. Since this $V_{GS}$ voltage is positive, transistor P11 will be strongly turned off.

Alternatively, assuming that $VDD_{SYS}$ is equal to 3.3V, and that $VDD_{INT}$ is equal to 2.5V, and that 2.5V transistors with a $V_{TP}$ (PMOS threshold) of 0.4V are being used, the "off" $V_{GS}$ voltage of transistor P11 will be equal to 2.5V+1.2V−3.3V=+0.4V. Since this $V_{GS}$ voltage is positive, transistor P11 will be strongly turned off.

TABLE 1

| Stage/ PMOS Transistor | Gate Voltage $V_G$ | Source Voltage $V_S$ | Gate to Source Voltage $V_{GS} = V_G - V_S$ |
|---|---|---|---|
| Stage SG2, P2 on | $3 V_{TP}$ | $VDD_{SYS}$ | $3 V_{TP} - VDD_{SYS}$ |
| Stage SG2, P2 off | $VDD_{SYS} - V_{TP}$ | $VDD_{SYS}$ | $-V_{TP}$ |
| Stage SG3, P4 on | $2 V_{TP}$ | $VDD_{SYS} - V_{TP}$ | $3 V_{TP} - VDD_{SYS}$ |
| Stage SG3, P4 off | $VDD_{SYS} - 2 V_{TP}$ | $VDD_{SYS} - V_{TP}$ | $-V_{TP}$ |
| Stage SG4, P7 on | $V_{TP}$ | $VDD_{SYS} - 2 V_{TP}$ | $3 V_{TP} - VDD_{SYS}$ |
| Stage SG4, P7 off | $VDD_{SYS} - 3 V_{TP}$ | $VDD_{SYS} - 2 V_{TP}$ | $-V_{TP}$ |
| Stage SG5, P11 on | 0 | $VDD_{SYS} - 3 V_{TP}$ | $3 V_{TP} - VDD_{SYS}$ |
| Stage SG5, P11 off | $VDD_{INT}$ | $VDD_{SYS} - 3 V_{TP}$ | $VDD_{INT} + 3 V_{TP} - VDD_{SYS}$ |

Table 1 below enumerates the gate-to-source operating conditions for the PMOS transistors that can be switched on/off in stages SG2-SG5 of FIGS. 6 and 9. As previously described, these PMOS transistors include P2, P4, P7 and P11, respectively. Referring to Table 1, the source voltage ($V_S$), the gate voltage ($V_G$) and the gate-to-source voltage $V_{GS}$ ($V_{GS}=V_G-V_S$) are tabulated for each of these PMOS transistors.

As shown in Table 1, when the switched PMOS transistors in stages SG2-SG5 are turned on, their gate-to-source voltage $V_{GS}$ will be the same: $3V_{TP}-VDD_{SYS}$. For example, assuming that $VDD_{SYS}$ is equal to 5V, and that 3.3V transistors with a $V_{TP}$ (PMOS threshold) of 0.6V are being used, the $V_{GS}$ "on" voltage of transistors P2, P4, P7 and P11 will be equal to 1.8V−5V=−3.2V. Moreover, since a $V_{GS}$ "on" voltage of −3.2V is approximately equal to 5 PMOS thresholds (2.3V÷0.6V≈5), PMOS transistors P2, P4, P7 and P11 will be strongly turned on. Furthermore, since these transistors are 3.3V transistors, their gate oxide will not be damaged by a $V_{GS}$ of −3.2V.

Alternatively, assuming that $VDD_{SYS}$ is equal to 3.3V, and that 2.5V transistors with a $V_{TP}$ (PMOS threshold) of 0.4V are being used, the $V_{GS}$ "on" voltage of transistors P2, P4, P7 and P11 will be equal to 1.2V−3.3V=−2.1V. Moreover, since a $V_{GS}$ "on" voltage of −2.1V is approximately equal to 5 PMOS thresholds (2.1V÷0.4V≈5), PMOS transistors P2, P4, P7 and P11 will be strongly turned on. Furthermore, since these transistors are 2.5V transistors, their gate oxide will not be damaged by a $V_{GS}$ of −2.1V.

In summary, the on/off gate-to-source voltages $V_{GS}$ of the switched PMOS transistors in stages SG2-SG5 will adequately turn these transistors on/off, and the maximum gate-to-source voltages $V_{GS}$ will remain within acceptable limits.

Table 2 below enumerates the source-to-drain operating conditions for the PMOS transistors that can be switched on/off in stages SG2-SG5 of FIGS. 6 and 9. As previously described, these PMOS transistors include P2, P4, P7 and P11, respectively. Referring to Table 2, the source voltage ($V_S$), the drain voltage ($V_D$) and the source-to-drain voltage $V_{SD}$ ($V_{SD}=V_S-V_D$) are tabulated for each of these PMOS transistors.

As shown in Table 2, when the switched PMOS transistors in stages SG2-SG5 are turned on, their source-to-drain voltages $V_{SD}$ will be equal to 0V. Therefore, their source-to-drain voltages will remain within acceptable limits for 3.3V transistors operating from a $VDD_{SYS}$ of 5V, and for 2.5V transistors operating from a $VDD_{SYS}$ of 3.3V.

As further shown in Table 2, when switched PMOS transistor P2 in stage SG2 is turned off, its "off" source-to-drain voltage $V_{SD}$ will be equal to $VDD_{SYS}-3V_{TP}$. Thus, assuming that $VDD_{SYS}$ is equal to 5V, and that 3.3V transistors with a $V_{TP}$ (PMOS threshold) of 0.6V are being used, the "off" $V_{SD}$ voltage of transistor P2 will be equal to 5V−1.8V=+3.2V. Therefore, the $V_{SD}$ voltage of transistor P2 is within acceptable limits for a 3.3V transistor.

Alternatively, assuming that $VDD_{SYS}$ is equal to 3.3V, and that 2.5V transistors with a $V_{TP}$ (PMOS threshold) of 0.4V are being used, the "off" $V_{SD}$ voltage of transistor P2 will be equal to 3.3V−1.2V=+2.1V. Therefore, the $V_{SD}$ voltage of transistor P2 is within acceptable limits for a 2.5V transistor.

Again referring to Table 2, when switched PMOS transistors P4, P7 and P11 in stages SG3-SG5 are turned off, their "off" source-to-drain voltage $V_{SD}$ will be equal to $VDD_{SYS}$−$4V_{TP}$. Thus, assuming that $VDD_{SYS}$ is equal to 5V, and that 3.3V transistors with a $V_{TP}$ (PMOS threshold) of 0.6V are being used, the "off" $V_{SD}$ voltage of transistors P4, P7 and P11 will be equal to 5V−2.4V=+2.6V. Therefore, the $V_{SD}$ voltages of transistors P4, P7 and P11 are within acceptable limits for 3.3V transistors.

Alternatively, assuming that $VDD_{SYS}$ is equal to 3.3V, and that $VDD_{INT}$ is equal to 2.5V, and that 2.5V transistors with a $V_{TP}$ (PMOS threshold) of 0.4V are being used, the "off" $V_{SD}$ voltage of transistors P4, P7 and P11 will be equal to 3.3V−1.6V=+1.7V. Therefore, the $V_{SD}$ voltages of transistors P4, P7 and P11 are within acceptable limits for 2.5V transistors.

that $VDD_{SYS}$ is equal to 5V, and that 3.3V transistors with a $V_{TP}$ (PMOS threshold) of 0.6V are being used, the "off" $V_{DG}$ voltage of transistor P2 will be equal to 2.4V−5V=−2.6V. Therefore, the $V_{DG}$ voltage of transistor P2 is within acceptable limits for a 3.3V transistor.

Alternatively, assuming that $VDD_{SYS}$ is equal to 3.3V, and that 2.5V transistors with a $V_{TP}$ (PMOS threshold) of 0.4V are being used, the "off" $V_{DG}$ voltage of transistor P2 will be equal to 1.6V−3.3V=−1.7V. Therefore, the $V_{DG}$ voltage of transistor P2 is within acceptable limits for a 2.5V transistor.

Again referring to Table 3, when switched PMOS transistors P4 and P7 in stages SG3-SG4 are turned off, their "off" drain-to-gate voltage $V_{DG}$ will be equal to $5V_{TP}$−$VDD_{SYS}$. Thus, assuming that $VDD_{SYS}$ is equal to 5V, and that 3.3V transistors with a $V_{TP}$ (PMOS threshold) of 0.6V are being used, the "off" $V_{DG}$ voltage of transistors P4 and P7 will be

TABLE 2

| Stage/ PMOS Transistor | Source Voltage $V_S$ | Drain Voltage $V_D$ | Source to Drain Voltage $V_{SD} = V_S - V_D$ |
|---|---|---|---|
| Stage SG2, P2 on | $VDD_{SYS}$ | $VDD_{SYS}$ | 0 |
| Stage SG2, P2 off | $VDD_{SYS}$ | $3 V_{TP}$ | $VDD_{SYS} - 3 V_{TP}$ |
| Stage SG3, P4 on | $VDD_{SYS} - V_{TP}$ | $VDD_{SYS} - V_{TP}$ | 0 |
| Stage SG3, P4 off | $VDD_{SYS} - V_{TP}$ | $3 V_{TP}$ | $VDD_{SYS} - 4 V_{TP}$ |
| Stage SG4, P7 on | $VDD_{SYS} - 2 V_{TP}$ | $VDD_{SYS} - 2 V_{TP}$ | 0 |
| Stage SG4, P7 off | $VDD_{SYS} - 2 V_{TP}$ | $2 V_{TP}$ | $VDD_{SYS} - 4 V_{TP}$ |
| Stage SG5, P11 on | $VDD_{SYS} - 3 V_{TP}$ | $VDD_{SYS} - 3 V_{TP}$ | 0 |
| Stage SG5, P11 off | $VDD_{SYS} - 3 V_{TP}$ | $V_{TP}$ | $VDD_{SYS} - 4 V_{TP}$ |

In summary, the on/off source-to-drain voltages $V_{SD}$ of the switched PMOS transistors in stages SG2-SG5 will remain within acceptable limits, under all circuit conditions.

Table 3 below enumerates the drain-to-gate operating conditions for the PMOS transistors that can be switched on/off in stages SG2-SG5 of FIGS. 6 and 9. As previously described, these PMOS transistors include P2, P4, P7 and P11, respectively. Referring to Table 3, the drain voltage ($V_D$), the gate voltage ($V_G$) and the drain-to-gate voltage $V_{DG}$ ($V_{DG}$=$V_D$−$V_G$) are tabulated for each of these PMOS transistors.

As shown in Table 3, when the switched PMOS transistors in stages SG2-SG5 are turned on, their drain-to-gate voltages $V_{DG}$ will be the same: $VDD_{SYS}$−$3V_{TP}$. For example, assuming that $VDD_{SYS}$ is equal to 5V, and that 3.3V transistors with a $V_{TP}$ (PMOS threshold) of 0.6V are being used, the $V_{DG}$ voltage of transistors P2, P4, P7 and P11 will be equal to 5V−1.8V=2.3V. Therefore, since these transistors are 3.3V transistors, their gate oxide will not be damaged by a $V_{DG}$ of 2.3V.

Alternatively, assuming that $VDD_{SYS}$ is equal to 3.3V, and that 2.5V transistors with a $V_{TP}$ (PMOS threshold) of 0.4V are being used, the $V_{DG}$ of transistors P2, P4, P7 and P11 will be equal to 3.3V−1.2V=2.1V. Therefore, since these transistors are 2.5V transistors, their gate oxide will not be damaged by a $V_{DG}$ of 2.1V.

As further shown in Table 3, when switched PMOS transistor P2 in stage SG2 is turned off, its "off" drain-to-gate voltage $V_{DG}$ will be equal to $4V_{TP}$−$VDD_{SYS}$. Thus, assuming equal to 3V−5V=−2V. Therefore, the $V_{DG}$ voltages of transistors P4 and P7 are within acceptable limits for 3.3V transistors.

Alternatively, assuming that $VDD_{SYS}$ is equal to 3.3V, and that $VDD_{INT}$ is equal to 2.5V, and that 2.5V transistors with a $V_{TP}$ (PMOS threshold) of 0.4V are being used, the "off" $V_{DG}$ voltage of transistors P4 and P7 will be equal to 2V−3.3V=−1.3V. Therefore, the $V_{DG}$ voltages of transistors P4 and P7 are within acceptable limits for 2.5V transistors.

As shown in Table 3, when switched PMOS transistor P11 in stage SG5 is turned off, its "off" drain-to-gate voltage $V_{DG}$ will be equal to $V_{TP}$−$VDD_{INT}$. Furthermore, since this expression only contains low voltage parameters (i.e. the low voltage PMOS transistor threshold $V_{TP}$, and the low voltage power supply voltage $VDD_{INT}$), the resulting "off" $V_{DG}$ voltage of transistor P11 will always remain within acceptable limits for 3.3V transistors, and for 2.5V transistors. For example, assuming that $VDD_{SYS}$ is equal to 5V, and that $VDD_{INT}$ is equal to 3.3V, and that 3.3V transistors with a $V_{TP}$ (PMOS threshold) of 0.6V are being used, the "off" $V_{DG}$ voltage of transistor P11 will be equal to 0.6V−3.3V=−2.7V. Therefore, the $V_{DG}$ voltage of transistor P11 is within acceptable limits for a 3.3V transistor.

Alternatively, assuming that $VDD_{SYS}$ is equal to 3.3V, and that $VDD_{INT}$ is equal to 2.5V, and that 2.5V transistors with a $V_{TP}$ (PMOS threshold) of 0.4V are being used, the "off" $V_{DG}$ voltage of transistor P11 will be equal to 0.4V−2.5V=−2.1V. Therefore, the $V_{DG}$ voltage of transistor P11 is within acceptable limits for a 2.5V transistor.

TABLE 3

| Stage/PMOS Transistor | Drain Voltage $V_D$ | Gate Voltage $V_G$ | Drain to Gate Voltage $V_{DG} = V_D - V_G$ |
|---|---|---|---|
| Stage SG2, P2 on | $VDD_{SYS}$ | $3 V_{TP}$ | $VDD_{SYS} - 3 V_{TP}$ |
| Stage SG2, P2 off | $3 V_{TP}$ | $VDD_{SYS} - V_{TP}$ | $4 V_{TP} - VDD_{SYS}$ |
| Stage SG3, P4 on | $VDD_{SYS} - V_{TP}$ | $2 V_{TP}$ | $VDD_{SYS} - 3 V_{TP}$ |
| Stage SG3, P4 off | $3 V_{TP}$ | $VDD_{SYS} - 2 V_{TP}$ | $5 V_{TP} - VDD_{SYS}$ |
| Stage SG4, P7 on | $VDD_{SYS} - 2 V_{TP}$ | $V_{TP}$ | $VDD_{SYS} - 3 V_{TP}$ |
| Stage SG4, P7 off | $2 V_{TP}$ | $VDD_{SYS} - 3 V_{TP}$ | $5 V_{TP} - VDD_{SYS}$ |
| Stage SG5, P11 on | $VDD_{SYS} - 3 V_{TP}$ | 0 | $VDD_{SYS} - 3 V_{TP}$ |
| Stage SG5, P11 off | $V_{TP}$ | $VDD_{INT}$ | $V_{TP} - VDD_{INT}$ |

In summary, the on/off drain-to-gate voltages $V_{DG}$ of the switched PMOS transistors in stages SG2-SG5 will remain within acceptable limits, under all circuit conditions.

In addition, although the examples shown above have been limited to VDD voltages of 5V, 3.3V, and 2.5V, the invention can be utilized with other VDD voltages. Furthermore, in accordance with the invention, as the $VDD_{SYS}$ and $VDD_{INT}$ voltages become further apart, additional diode-connected PMOS transistors may be required, and additional buffer stages may also be required.

It should be understood that the above descriptions are examples of the invention, and that various alternatives of the invention described herein may be employed in practicing the invention. Therefore, it is intended that the following claims define the scope of the invention, and that structures and methods within the scope of these claims and their equivalents be covered thereby.

What is claimed is:

1. An output buffer comprising:
a first inverter stage having a first PMOS transistor, the first PMOS transistor having a gate, a source, and a drain, the source being directly connected to a system power supply line;
a second inverter stage having a second PMOS transistor, a first voltage drop block directly connected to the second PMOS transistor, and an NMOS transistor directly connected to the first voltage drop block, the second PMOS transistor having a gate, a source, and a drain, the source of the second PMOS transistor being directly connected to the system power supply line, the drain of the second PMOS transistor being directly connected to the gate of the first PMOS transistor; and
a third inverter stage having a second voltage drop block directly connected to the system power supply line, a third PMOS transistor directly connected to the second voltage drop block, a third voltage drop block directly connected to the third PMOS transistor, and an NMOS transistor directly connected to the third voltage drop block, the third PMOS transistor having a gate, a source, and a drain, the drain of the third PMOS transistor being directly connected to the gate of the second PMOS transistor.

2. The output buffer of claim 1 wherein the first voltage drop block and the third voltage drop block have substantially equal voltage drops.

3. The output buffer of claim 2 wherein a voltage drop across the first voltage drop block is larger than a voltage drop across the second voltage drop block.

4. The output buffer of claim 3 and further comprising a fourth inverter stage having a fourth voltage drop block, a fourth PMOS transistor directly connected to the fourth voltage drop block, a fifth voltage drop block directly connected to the fourth PMOS transistor, and an NMOS transistor directly connected to the fifth voltage drop block, the fourth PMOS transistor having a gate, a source, and a drain, the drain of the fourth PMOS transistor being directly connected to the gate of the third PMOS transistor, the fourth voltage drop block and the fifth voltage drop block having substantially equal voltage drops.

5. An output buffer comprising:
a first inverter stage having:
a first upper circuit having a first upper input node and a first upper output node, the first upper input node being directly connected to a power line, the first upper circuit having a first upper voltage drop from the first upper input node to the first upper output node;
a first PMOS transistor directly connected to the first upper output node, the first PMOS transistor not being directly connected to the power line;
a first lower circuit having a first lower input node and a first lower output node, the first lower input node being directly connected to the first PMOS transistor, the first lower circuit having a first lower voltage drop from the first lower input node to the first lower output node; and
a first NMOS transistor directly connected to the first lower output node;
a second inverter stage having:
a second upper circuit having a second upper input node and a second upper output node, the second upper input node being directly connected to the power line, the second upper circuit having a second upper voltage drop from the second upper input node to the second upper output node that is less than the first upper voltage drop;
a second PMOS transistor directly connected to the second upper output node and the first PMOS transistor, the second PMOS transistor not being directly connected to the power line;
a second lower circuit having a second lower input node and a second lower output node, the second lower input node being directly connected to the second PMOS transistor, the second lower circuit having a second lower voltage drop from the second lower input node to the second lower output node that is greater than the first lower voltage drop; and
a second NMOS transistor directly connected to the second lower output node.

6. The output buffer of claim 5 and further comprising a resistive element having a first node directly connected to the first and second PMOS transistors, and a second node directly connected to a supply line, the power line not being directly connected to the supply line.

7. The output buffer of claim 5 wherein the first upper circuit includes a number of diode-connected transistors, the second upper circuit includes a number of diode-connected transistors that is one less than the number of diode-connected transistors in the first upper circuit, the first lower circuit includes a number of diode-connected transistors, and the second lower circuit includes a number of diode-connected transistors that is one more than the number of diode-connected transistors in the first lower circuit.

8. The output buffer of claim 5 and further comprising an input inverter stage having an input PMOS transistor directly connected to a supply line, and an input NMOS transistor directly connected to the input PMOS transistor, the input PMOS transistor having a gate, a source, and a drain, the drain of the input PMOS transistor being directly connected to the first PMOS transistor and the first NMOS transistor, the power line not being directly connected to the supply line.

9. The output buffer of claim 8 wherein the gate of the input PMOS transistor is directly connected to the second NMOS transistor.

10. The output buffer of claim 8 and further comprising a third inverter stage having:
a third upper circuit having a third upper input node and a third upper output node, the third upper input node being directly connected to the power line, the third upper circuit having a third upper voltage drop from the third upper input node to the third upper output node that is less than the second upper voltage drop;
a third PMOS transistor directly connected to the third upper output node and the second PMOS transistor, the third PMOS transistor not being directly connected to the power line;
a third lower circuit having a third lower input node and a third lower output node, the third lower input node being directly connected to the third PMOS transistor, the third lower circuit having a third lower voltage drop from the third lower input node to the third lower output node that is greater than the second lower voltage drop; and
a third NMOS transistor directly connected to the third lower output node.

11. The output buffer of claim 10 and further comprising:
a first resistive element having a first node directly connected to the first and second PMOS transistors, and a second node directly connected to the supply line; and
a second resistive element having a first node directly connected to the second and third PMOS transistors, and a second node directly connected to the supply line, the second resistive element not being directly connected to the first resistive element.

12. The output buffer of claim 10 wherein the first upper circuit includes a number of diode-connected transistors, the second upper circuit includes a number of diode-connected transistors that is one less than the number of diode-connected transistors in the first upper circuit, the third upper circuit includes a number of diode-connected transistors that is two less than the number of diode-connected transistors in the first upper circuit, the first lower circuit includes a number of diode-connected transistors, the second lower circuit includes a number of diode-connected transistors that is one more than the number of diode-connected transistors in the first lower circuit, and the third lower circuit includes a number of diode-connected transistors that is two more than the number of diode-connected transistors in the first lower circuit.

13. The output buffer of claim 10 wherein the gate of the input PMOS transistor is directly connected to the second NMOS transistor, and the drain of the input PMOS transistor is directly connected to the third NMOS transistor.

14. The output buffer of claim 10 and further comprising a fourth inverter stage having a fourth PMOS transistor directly connected to the power line and the third PMOS transistor, a fourth lower circuit directly connected to the fourth PMOS transistor, and a fourth NMOS transistor directly connected to the fourth lower circuit, the fourth lower circuit having a fourth lower voltage drop from the fourth PMOS transistor to the fourth NMOS transistor that is substantially equal to the third lower voltage drop.

15. The output buffer of claim 14 and further comprising an output inverter stage having a first output PMOS transistor directly connected to the power line and the fourth PMOS transistor, a second output PMOS transistor directly connected to the first output PMOS transistor, a first output NMOS transistor directly connected to the second output PMOS transistor, and a second output NMOS transistor directly connected to the first output NMOS transistor.

16. The output buffer of claim 15 and further comprising:
a first resistive element having a first node directly connected to the first and second PMOS transistors, and a second node directly connected to the supply line;
a second resistive element having a first node directly connected to the second and third PMOS transistors, and a second node directly connected to the supply line;
a third resistive element having a first node directly connected to the third and fourth PMOS transistors, and a second node directly connected to the supply line; and
a fourth resistive element having a first node directly connected to the fourth and first output PMOS transistors, and a second node directly connected to the supply line.

17. The output buffer of claim 5 and further comprising a third inverter stage having:
a third upper circuit having a third upper input node and a third upper output node, the third upper input node being directly connected to the power line, the third upper circuit having a third upper voltage drop from the third upper input node to the third upper output node that is less than the second upper voltage drop;
a third PMOS transistor directly connected to the third upper output node and the second PMOS transistor, the third PMOS transistor not being directly connected to the power line;
a third lower circuit having a third lower input node and a third lower output node, the third lower input node being directly connected to the third PMOS transistor, the third lower circuit having a third lower voltage drop from the third lower input node to the third lower output node that is greater than the second lower voltage drop; and
a third NMOS transistor directly connected to the third lower output node.

18. The output buffer of claim 17 and further comprising:
a first resistive element having a first node directly connected to the first and second PMOS transistors, and a second node directly connected to a supply line, the power line not being directly connected to the supply line; and
a second resistive element having a first node directly connected to the second and third PMOS transistors, and a second node directly connected to the supply line, the second resistive element not being directly connected to the first resistive element.

19. The output buffer of claim 17 wherein the first upper circuit includes a number of diode-connected transistors, the second upper circuit includes a number of diode-connected transistors that is one less than the number of diode-connected transistors in the first upper circuit, the third upper circuit includes a number of diode-connected transistors that is two less than the number of diode-connected transistors in the first upper circuit, the first lower circuit includes a number of diode-connected transistors, the second lower circuit includes a number of diode-connected transistors that is one more than the number of diode-connected transistors in the first lower circuit, and the third lower circuit includes a number of diode-connected transistors that is two more than the number of diode-connected transistors in the first lower circuit.

* * * * *

UNITED STATES PATENT AND TRADEMARK OFFICE
CERTIFICATE OF CORRECTION

| | | |
|---|---|---|
| PATENT NO. | : 7,863,962 B2 | Page 1 of 1 |
| APPLICATION NO. | : 12/148224 | |
| DATED | : January 4, 2011 | |
| INVENTOR(S) | : Ronald Pasqualini | |

It is certified that error appears in the above-identified patent and that said Letters Patent is hereby corrected as shown below:

Column 11, line 45, delete "thresholds (2.3V" and replace with --thresholds (3.2V--.
Column 12, line 10, delete "5V-1.8V=2.3V" and replace with --5V-1.8V=3.2V--.
Column 12, line 62, delete "thresholds (2.3V" and replace with --thresholds (3.2V--.
Column 13, line 3, delete "2.1V + 0.4V" and replace with --2.1V/0.4V--.
Column 15, line 42, delete "thresholds (2.3V" and replace with --thresholds (3.2V--.

Signed and Sealed this
Fifteenth Day of February, 2011

David J. Kappos
*Director of the United States Patent and Trademark Office*